United States Patent
Srinivasan et al.

(10) Patent No.: US 8,023,301 B1
(45) Date of Patent: Sep. 20, 2011

(54) CONTENT ADDRESSABLE MEMORY DEVICE HAVING STATE INFORMATION PROCESSING CIRCUITRY

(75) Inventors: Varadarajan Srinivasan, Los Altos Hills, CA (US); Maheshwaran Srinivasan, Sunnyvale, CA (US); Chetan Deshpande, San Jose, CA (US); Sandeep Khanna, Los Altos, CA (US); Venkat Rajendher Reddy Gaddam, Sunnyvale, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/899,171

(22) Filed: Oct. 6, 2010

Related U.S. Application Data

(63) Continuation-in-part of application No. 12/818,555, filed on Jun. 18, 2010.

(60) Provisional application No. 61/218,813, filed on Jun. 19, 2009.

(51) Int. Cl.
*G11C 15/00* (2006.01)
(52) U.S. Cl. .................. 365/49.18; 365/49.17; 365/49.1
(58) Field of Classification Search ................ 365/49.18, 365/49.17, 49.1
See application file for complete search history.

(56) References Cited

U.S. PATENT DOCUMENTS

| | | | |
|---|---|---|---|
| 6,081,440 A | 6/2000 | Washburn et al. | |
| 6,240,990 B1 | 6/2001 | Claussnitzer | |
| 6,253,280 B1 | 6/2001 | Voelkel | |
| 6,317,350 B1 | 11/2001 | Pereira et al. | 365/49 |
| 6,381,673 B1 | 4/2002 | Srinivasan et al. | |
| 6,499,081 B1 | 12/2002 | Nataraj et al. | 711/108 |
| 6,564,289 B2 | 5/2003 | Srinivasan et al. | |
| 6,567,340 B1 | 5/2003 | Nataraj et al. | |
| 6,591,331 B1 | 7/2003 | Khanna | |
| 6,665,202 B2 | 12/2003 | Lindahl et al. | |
| 6,757,779 B1 | 6/2004 | Nataraj et al. | |
| 6,804,744 B1 | 10/2004 | Abbas | |
| 6,867,989 B1 | 3/2005 | Roy | |
| 6,934,795 B2 | 8/2005 | Nataraj et al. | |
| 6,944,709 B2 | 9/2005 | Nataraj et al. | |
| 7,000,066 B1 | 2/2006 | Wanzakhade et al. | |
| 7,092,311 B1 | 8/2006 | Proebsting | |
| 7,110,407 B1 | 9/2006 | Khanna | |
| 7,110,408 B1 | 9/2006 | Nataraj | |
| 7,143,231 B1 | 11/2006 | Srinivasan et al. | |
| 7,272,027 B2 | 9/2007 | Pereira et al. | |
| 7,382,637 B1 * | 6/2008 | Rathnavelu et al. | 365/49.17 |
| 7,403,407 B1 | 7/2008 | Wanzakhade | |
| 7,436,688 B1 | 10/2008 | Maheshwari | |
| 7,474,545 B1 | 1/2009 | Maheshwari | |

(Continued)

OTHER PUBLICATIONS

U.S. Appl. No. 12/495,202, filed Jun. 30, 2009, Deshpande et al.

*Primary Examiner* — Jason Lappas
(74) *Attorney, Agent, or Firm* — Mahamedi Paradice Kreisman LLP; William L. Paradice, III

(57) ABSTRACT

Present embodiments allow a search engine to quickly save and restore state information to and from an external state memory when switching between multiple data flows by transferring the state information between the search engine and the external state memory in a parallel manner. More specifically, for CAM-based search engines configured according to present embodiments, the CAM array includes state information gating circuits that selectively allow state information stored in the CAM array's match latches to be transposed onto the array's bit lines and then read from the array using the array's sense amplifiers.

24 Claims, 20 Drawing Sheets

U.S. PATENT DOCUMENTS

| | | |
|---|---|---|
| 7,487,200 B1 | 2/2009 | Srinivasan |
| 7,555,593 B1 | 6/2009 | Rosman |
| 7,907,432 B2 | 3/2011 | Deshpande et al. ....... 365/49.17 |
| 2010/0328981 A1 | 12/2010 | Deshpande et al. ....... 365/49.17 |

* cited by examiner

CONTENT ADDRESSABLE MEMORY DEVICE HAVING STATE INFORMATION PROCESSING CIRCUITRY

CROSS-REFERENCE TO RELATED APPLICATION

This application is a continuation-in-part and claims the benefit under 35 USC 120 of the co-pending and commonly owned U.S. patent application Ser. No. 12/818,555 entitled "Content Addressable Memory Device Capable of Parallel State Information Transfers" filed on Jun. 18, 2010, which claims priority under 35 USC 119(e) from U.S. Provisional Application No. 61/218,813 filed on Jun. 19, 2009. These applications are incorporated by reference herein.

TECHNICAL FIELD

The present invention relates generally to CAM devices and specifically to processing multiple flows in a CAM device.

BACKGROUND OF RELATED ART

Content addressable memory (CAM) devices are frequently used in network switching and routing applications to determine forwarding destinations for data packets, and are also used to provide more advanced network Quality of Service (QoS) functions such as traffic shaping, traffic policing, rate limiting, and so on. More recently, CAM devices have been deployed in network environments to implement intrusion detection systems and to perform deep packet inspection tasks. A CAM device can be instructed to compare a selected portion of an incoming packet with CAM words stored in an array within the CAM device.

More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result, which is typically stored in a match latch associated with the matching CAM row. If one or more of the match lines are asserted, a match flag is asserted to indicate the match condition, and a priority encoder determines the match address or index of the highest priority matching (HPM) entry in the CAM array.

Because today's networking components process numerous different flows (e.g., groups of packets originating from a common source) at the same time, effective deployment of CAM devices in network environments favors the ability to quickly switch between multiple flows. To switch a CAM device between different flows, search operations for the currently active first flow (F1) are paused, and the match data (also referred to as state information) of the first flow is read from the match latches and stored in an external state memory. Then, the packets of the awaiting second flow (F2) are provided to the CAM device, and search operations are commenced for the second flow. To switch back to the first flow, search operations for the second flow (F2) are paused, the state information of the second flow F2 is saved in the external state memory, and then the state information of the first flow F1 is restored to the CAM array (e.g., loaded back into the array's match latches) from the external state memory.

The speed with which a CAM device can switch between different flows is typically dependent upon the number of active states (e.g., match values of "1" indicating a match condition) present in the CAM array's match latches. For example, some techniques for saving state information generate the HPM addresses of all active states using the CAM device's priority encoder, and then sequentially output the HPM addresses to the state memory. Other techniques read the state information from the CAM array's match latches in a serial fashion to the external state memory. However, as the number of active states in CAM devices increases, these prior techniques are becoming increasingly insufficient to maintain ever-faster network line speeds. For example, CAM devices configured to store a number of non-deterministic finite automaton (NFA) that embody an access control list (ACL) typically store many thousands of states, of which hundreds or even a few thousand can be active at any given time. For such CAM devices, the time required to transfer state information between the CAM device and an associated external state memory can be significant, during which search operations are not performed in the CAM device. As a result, switching between flows in such CAM devices has an increasingly adverse effect upon device throughput.

Accordingly, there is a need to improve the speed with which state information can be transferred between the CAM device and an associated external state memory.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

A method and apparatus for more efficient switching between flows in a CAM device are disclosed. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Present embodiments allow a search engine to save and restore state information to and from an external state memory when switching between multiple input flows faster than conventional approaches by transferring the state information between the search engine and the external state memory in a parallel manner. More specifically, for CAM-based search engines configured according to present embodiments, the CAM array includes state information gating circuits that selectively allow state information stored in the CAM array's match latches to be transposed onto the array's bit lines and then read from the array using the array's sense amplifiers, thereby enabling the state information to be read from the array for storage in the external state memory in a parallel manner. Similarly, state information stored in the external memory can be written in parallel onto the array's bit lines via the array's write drivers, and then transposed from the bit lines into the rows' match latches via the gating circuits to restore the state information to the CAM device. In this manner, present embodiments utilize existing CAM array components (e.g., bit lines, sense amplifiers, and write drivers) to quickly transfer state information between the CAM array and the external state memory, thereby significantly increasing state information transfer speeds with the addition of minimal circuitry (e.g., the state information gating circuits).

Figure 1:
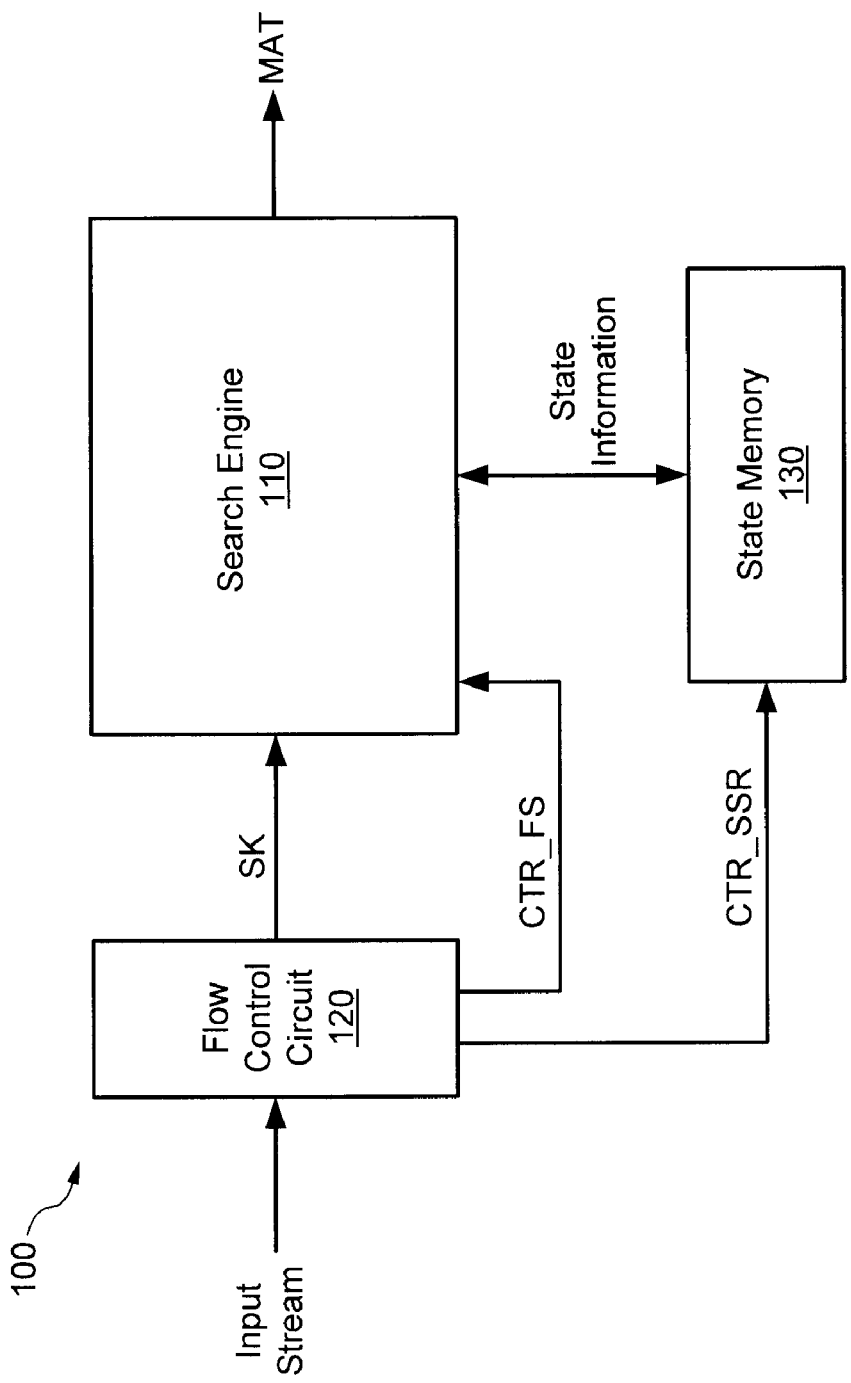
FIG. 1 shows a block diagram of a search system in accordance with some of the present embodiments.

FIG. 1 shows a search system 100 within which the present embodiments may be implemented. Search system 100 includes a search engine 110, a flow control circuit 120, and an external state memory 130. Search engine 110 stores a number of patterns to be searched for in search keys belonging to multiple flows. The flow control circuit 120 has an input to receive an input stream (e.g., incoming packets) from an input source (e.g., a blade or line card of a router or other network device), has a first output to provide search keys (SK) to search engine 110, has a second output to provide a flow switch control signal (CTR_FS) to search engine 110, and has a third output to provide a save state and restore control signal (CTR_SSR) to state memory 130. For some embodiments operation, flow control circuit 120 receives incoming packets belonging to various flows, extracts header information from each packet to identify which flow the packet belongs to, and forwards the packets to search engine 110 for search operations. As discussed in more detail below, when flow control circuit 120 detects that a packet to be sent to search engine 110 belongs to a different flow than the previously sent packet, flow control circuit 120 initiates a flow switch operation in search engine 110 (e.g., by asserting CTR_FS) and facilitates the transfer of state information between search engine 110 and state memory 130 (e.g., by asserting CTR_SSR).

Figure 2:
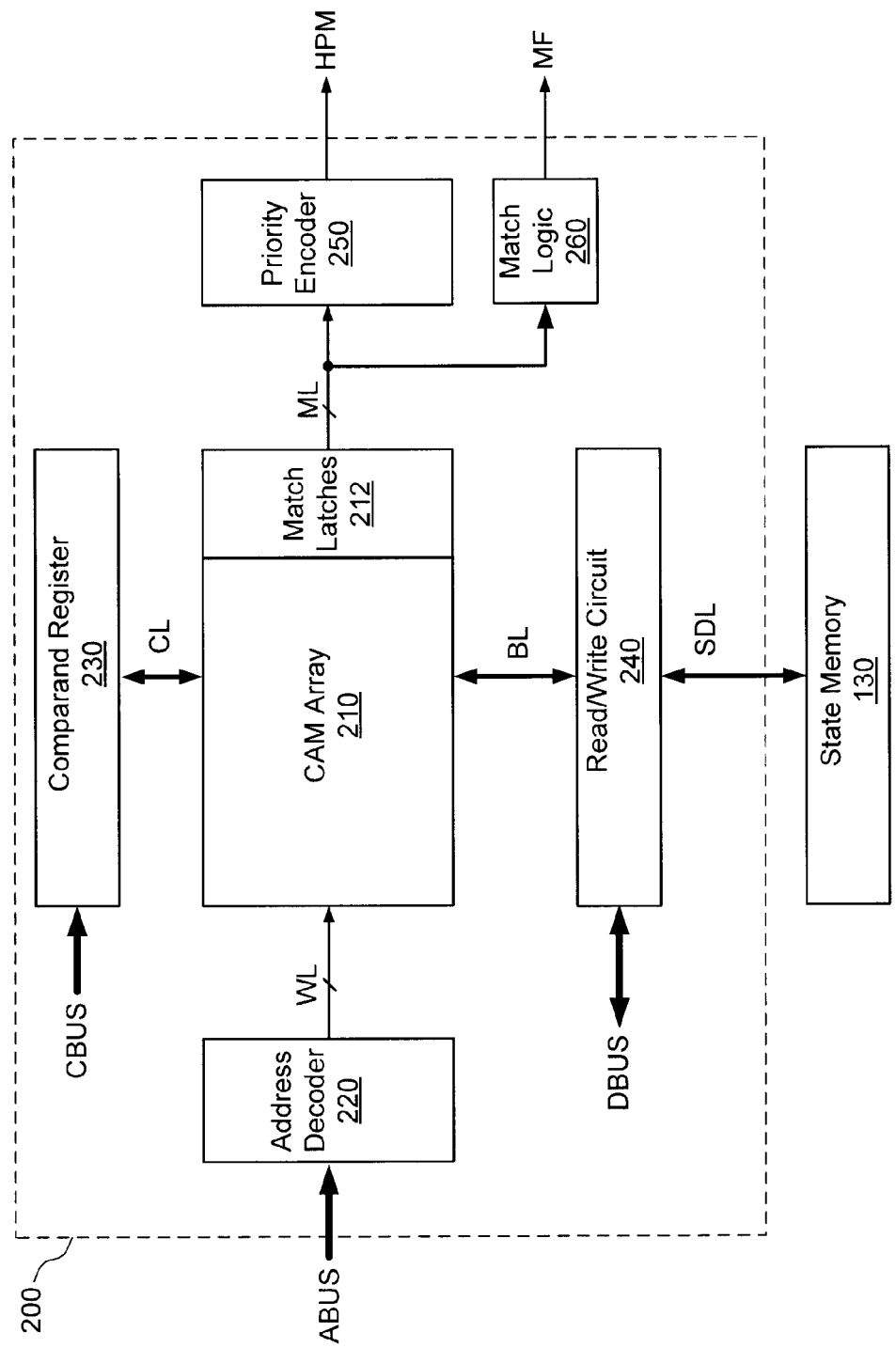
FIG. 2 shows a block diagram of a content addressable memory (CAM) device in accordance with some embodiments of FIG. 1.

For exemplary embodiments described herein, search engine 110 is a CAM device, although for alternate embodiments other search engines may be used. For example, FIG. 2 shows a CAM device 200 that is one embodiment of search engine 110. CAM device 200 includes a CAM array 210, an address decoder 220, a comparand register 230, a read/write circuit 240, a priority encoder circuit 250, and match logic 260. CAM array 210 includes any number of rows of CAM cells (not shown for simplicity in FIG. 2), where each row of CAM cells can be configured to store a data word. The CAM cells can be any suitable type of CAM cell including, for example, binary CAM cells, ternary CAM cells, and/or quaternary CAM cells. Further, while CAM array 210 is shown in FIG. 2 as a single CAM array, it may include any number of CAM array blocks that can be independently searched.

For some embodiments, CAM array 210 is of the type described in commonly-owned U.S. Pat. No. 7,643,353, which is incorporated by reference herein. For CAM arrays of the type described in U.S. Pat. No. 7,643,353, the rows of CAM cells are each selectively connected to a programmable routing structure (PRS) that can be configured to selectively route the match signal from any CAM row as an input match signal to itself and/or to any number of other arbitrarily selected CAM rows at the same time. The CAM array may also include a number of counter circuits that can be selectively connected to each other and/or to any number of the CAM rows by the PRS. In this manner, CAM arrays of the type disclosed in U.S. Pat. No. 7,643,353 can be configured to implement search operations for complex regular expressions having various metacharacters, quantifiers, and/or character classes.

More specifically, to store a complex regular expression in the CAM array disclosed in U.S. Pat. No. 7,643,353, the CAM array's PRS is programmed to implement a non-deterministic finite automaton (NFA) that embodies the complex regular expression, thereby mapping the NFA into the CAM array hardware. During search operations, the logic states of the match lines are indicative of the states of the corresponding NFA (e.g., where an asserted match line indicates that the corresponding state of the NFA is active, and a de-asserted match line indicates that the corresponding state of the NFA is inactive). In this manner, the match results stored in the CAM array's match latches can be used to indicate whether corresponding states of the NFA are active or inactive, thereby providing current state information for the NFA.

One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data. In addition, for some embodiments, the rows in CAM array 210 can be divided into a plurality of row segments, for example, to reduce the capacitive loading for each row or to provide multiple width/depth configurations for the array.

Each row of CAM cells (not shown in FIG. 2 for simplicity) in CAM array 210 is coupled to address decoder 220 via a corresponding word line WL, and to priority encoder 250 and well-known match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag indicative of a match condition in CAM array 210. If there is more than one matching entry in CAM array 210, match logic 260 may generate a multiple match flag to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data received from a data bus DBUS to CAM array 210 via the bit lines, and includes well-known sense amplifiers to read data from CAM array 210 onto DBUS. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

CAM array 210 also includes a plurality of match latches 212. Each match latch 212 is coupled to the match line ML of a corresponding row of CAM cells, and is used to store the match state of the corresponding CAM row during compare operations. For embodiments of CAM array 210 configured according to U.S. Pat. No. 7,643,353, the match states stored in the match latches 212 are indicative of corresponding states of the NFA(s) embodied by data stored in CAM array 210. In this manner, the match state information stored in the match latches 212 can be used to indicate whether each state of the NFA is active or inactive.

FIG. 2 also shows CAM device 200 coupled to the external state memory 130, which is configured to store state information for CAM array 210 during flow switch operations. For the exemplary embodiment of FIG. 2, state memory 130 is coupled to read/write circuit 240 via state data lines (SDL), each of which is associated with a corresponding column/bit line BL of CAM array 210. In this manner, state information read from CAM array 210 via bit lines BL by sense amplifiers within read/write circuit 240 can be forwarded in parallel to state memory 130 on the state data lines SDL, and state information read from state memory 130 via the data lines DL can be forwarded (e.g., restored) to CAM array 210 on bit lines BL by write drivers within read/write circuit 240.

State memory 130 can be any suitable type of memory element. For some embodiments, state memory 130 is a DRAM, although for alternate embodiments state memory 130 can be a Flash memory, EPROM, EEPROM, SRAM, or other suitable type of memory device. Further, for the exemplary embodiments described herein, state memory 130 is an external memory device, as depicted in FIG. 2. In this manner, a suitable memory device can be easily coupled to CAM array 210 and perform the functions of state memory 130. Of course, for other embodiments, state memory 130 can be formed on the same IC chip as CAM device 210 and/or search system 100.

Figure 3:
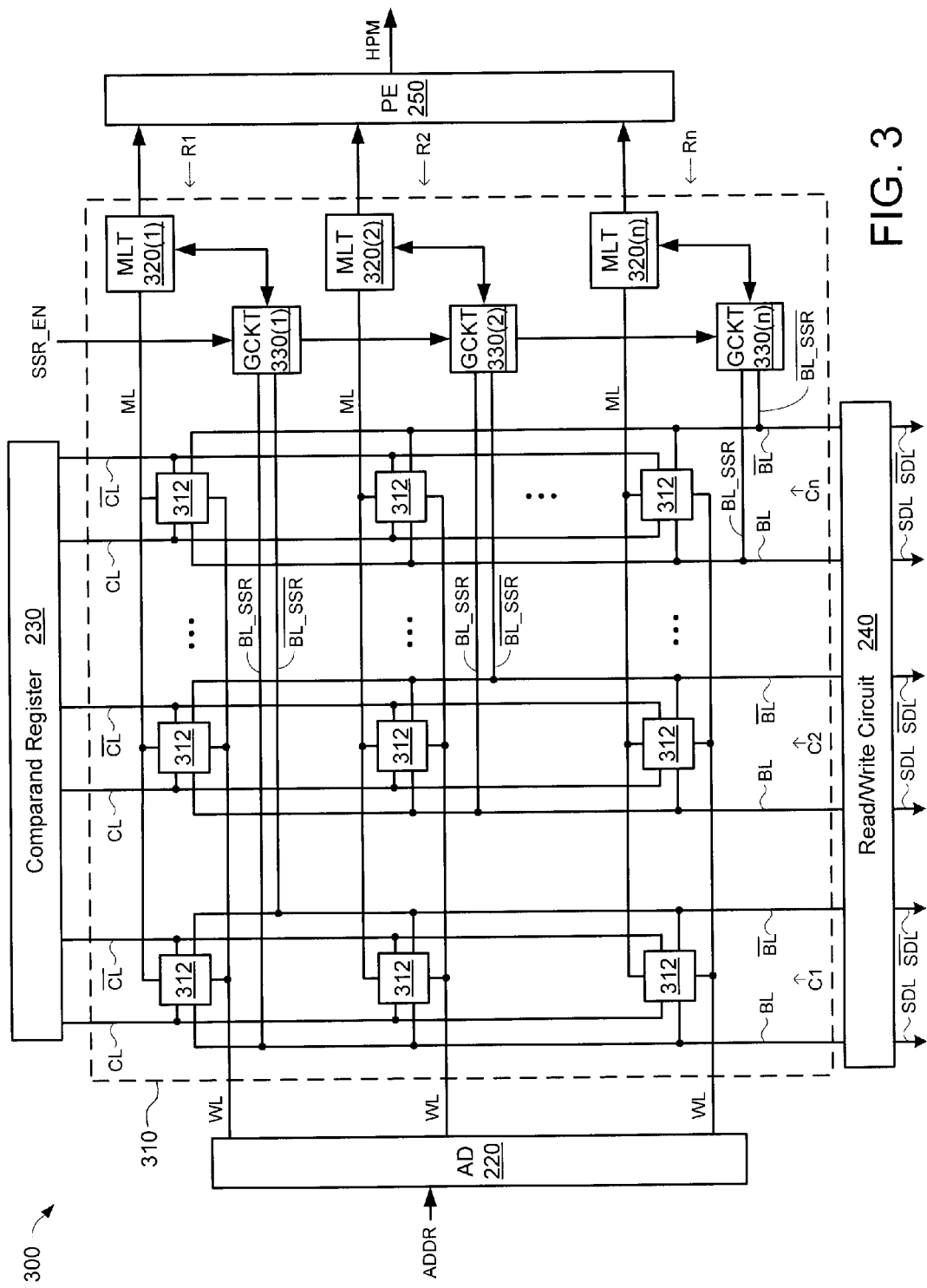
FIG. 3 shows a block diagram of one embodiment of the CAM array of FIG. 2.

FIG. 3 shows a portion of a CAM device 300 that is one embodiment of the CAM device 200 of FIG. 2. CAM device 300 is shown to include a CAM array 310, address decoder 220, comparand register 230, read/write circuit 240, and priority encoder 250. CAM array 310, which is one embodiment of CAM array 210 of FIG. 2, includes a plurality of CAM cells 312 arranged in a number of rows (R1-Rn) and columns (C1-Cn), includes a number of match latches 320(1)-320(n), and includes a number of state information gating circuits 330(1)-330(n). For the exemplary embodiment of FIG. 3, CAM array 310 includes the same number of rows and columns. However, for other embodiments, CAM array 310 may include a greater number of rows than columns, as discussed below with respect to FIG. 7. The CAM cells 312 can be any suitable type of CAM cell including, for example, binary, ternary, and/or quaternary CAM cells.

Each row of CAM array 310 includes a plurality of CAM cells 312, a match latch 320, and a state information gating circuit 330. More specifically, each row of CAM cells 312 is coupled to address decoder 220 via a corresponding word line WL, and is coupled to an associated match latch 320 via a corresponding match line ML. The word lines are selectively driven by address decoder 220 in response to an address to select one or more of rows of CAM cells 312 for writing or reading in a well-known manner. The match lines ML indicate match results of a compare operation performed in CAM array 310. The match latches 320, which can be any suitable register, latch, flip-flop, SRAM cell, DRAM cell, or other memory element, store the match results provided on the match lines ML and provide the match results to priority encoder 250. Although not shown for simplicity, for some embodiments, each match latch 320 can include a clock input to receive a match latch signal that causes the match latches 320 to latch the match signals provided on the match lines ML.

For exemplary embodiments described herein, the match lines ML are pre-charged to logic high (e.g., VDD) for compare operations, and if all CAM cells 312 in a row match the search key, the row's match line ML remains in its charged state to indicate the match condition. Conversely, if one or more CAM cell 312 in the row does not match the search key, those CAM cell(s) 312 discharge the match line ML toward ground potential (e.g., logic low) to indicate the mismatch condition.

Each column of CAM cells 312 is coupled to the comparand register 230 via a complementary comparand line pair CL/$\overline{CL}$, and to the read/write circuit 240 via a complementary bit line pair BL/$\overline{BL}$. The comparand register 230 includes a plurality of drivers (not shown for simplicity) that provide complementary comparand data to columns of CAM cells 312 during compare or search operations via the comparand line pairs CL/$\overline{CL}$. Although the comparand data present on a comparand line pair is generally referred to herein as being complementary comparand signals, a comparand line pair CL/$\overline{CL}$ may be driven to the same logic state (e.g., logic low or high) to mask compare operations within an entire column of the CAM array 310. The read/write circuit 240 provides/receives complementary CAM data to/from the columns of CAM cells 312 via the bit line pairs BL/$\overline{BL}$. More specifically, read/write circuit 240 includes a plurality of well-known sense amplifiers (not shown for simplicity) to read data read from the bit line pairs BL/$\overline{BL}$, and includes a plurality of well-known write drivers (not shown for simplicity) to write data into the CAM array 310 via the bit line pairs BL/$\overline{BL}$. Read/write circuit 240 is coupled to the external state memory 130 (not shown in FIG. 3 for simplicity) via a number of state data line pairs SDL/$\overline{SDL}$, where each state data line pair is associated with the bit line pair BL/$\overline{BL}$ in a corresponding column of CAM array 310.

For other embodiments, the complementary comparand lines CL/$\overline{CL}$ may be replaced by single-ended comparand lines, and/or the complementary bit lines BL/$\overline{BL}$ may be replaced by single-ended bit lines. In addition, for other embodiments, the comparand lines can be omitted, and the bit lines can be used to provide comparand data to the CAM array for compare operations. For alternate embodiments, encoded comparand data can be provided to the CAM array for search operations, for example, as described in commonly-owned U.S. Pat. No. 7,133,312, which is incorporated by reference herein.

In accordance with the present embodiments, the state information gating circuit 330 in each CAM row includes a first port coupled to the match latch 320 in the row, and includes a second port coupled to the bit line pair of an associated column of the CAM array. More specifically, for each given CAM row, the gating circuit 330 is coupled to a data port of the match latch 320 in the given row, and is also coupled to the bit line pair BL/$\overline{BL}$ of the associated column by a corresponding save state and restore bit line pair BL_SSR/$\overline{BL\_SSR}$. For example, the gating circuit 330(1) in the first row (R1) of the array is coupled to the match latch 320(1) in the first row (R1) and is coupled to the bit line pair BL/$\overline{BL}$ in the first column (C1), the gating circuit 330(2) in the second row (R2) of the array is coupled to the match latch 320(2) in the second row (R2) and is coupled to the bit line pair BL/$\overline{BL}$ in the second column (C2), and so on, where the gating circuit 330($n$) in the $n^{th}$ row (Rn) of the array is coupled to the match latch 320($n$) in the $n^{th}$ row (Rn) and is coupled to the bit line pair BL/$\overline{BL}$ in the $n^{th}$ column (Cn).

Each of state information gating circuits 330(1)-330($n$) also includes a control input to receive a save state and restore enable signal SSR_EN that can be used to selectively couple the match latches 320(1)-320($n$) in respective rows R1-Rn to the bit line pairs BL/$\overline{BL}$ in respective columns C1-Cn. In this manner, the state information gating circuits 330 allow state information (e.g., match results) stored for rows of CAM array 310 to be transposed onto columns of the CAM array and then provided in parallel to the external state memory (not shown in FIG. 3 for simplicity) using the CAM array's bit line pairs. More specifically, state information for rows R1-Rn that is stored in the match latches 320(1)-320($n$) can be simultaneously driven onto the bit line pairs BL/$\overline{BL}$ from the SSR bit line pairs BL_SSR/$\overline{BL\_SSR}$ by respective gating circuits 330(1)-330($n$) and thereafter read from the CAM array 310 in parallel by the sense amplifiers (not shown for simplicity) provided within read/write circuit 240, which in turn can output the state information in parallel from the CAM device 300 to the external state memory 130 (not shown in FIG. 3 for simplicity). Similarly, state information stored in the external state memory 130 can be provided in parallel to read/write circuit 240 and then driven in parallel onto the CAM array's bit line pairs BL/$\overline{BL}$ by write drivers provided within read/write circuit 240, and then written in parallel to the match latches 320(1)-320($n$) in corresponding rows R1-Rn by respective gating circuits 330(1)-330($n$) and SSR bit line pairs BL_SSR/$\overline{BL\_SSR}$.

Figure 4A:
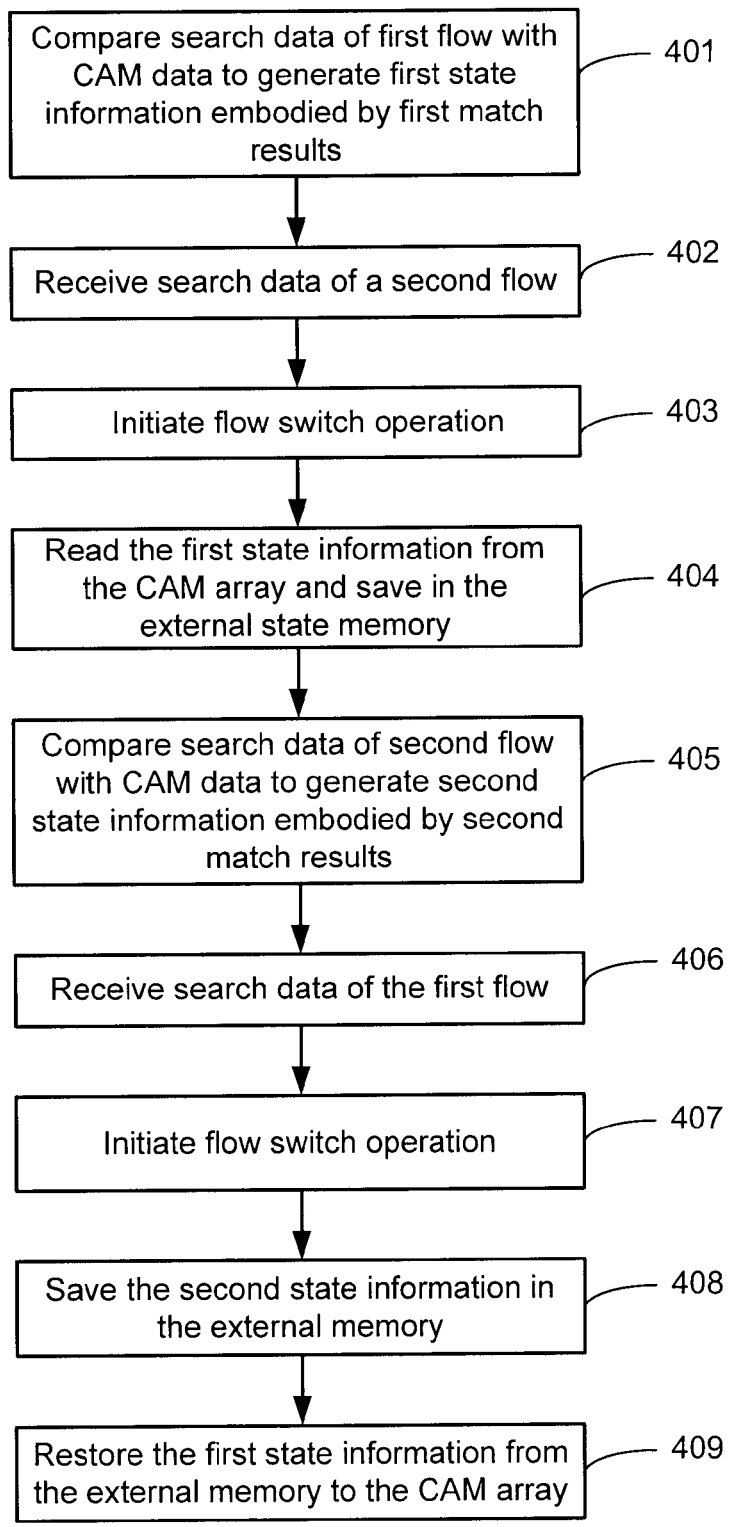
FIGS. 4A-4C are illustrative flow charts depicting an exemplary flow switch operation in accordance with some embodiments.

A general operation of the exemplary embodiment of the search system depicted in FIGS. 1-3 is described below with respect to the illustrative flow charts of FIGS. 4A-4C. First, search data (e.g., a number of search keys) of a first flow are provided to and compared with data stored in the CAM array 310 to generate match results therein (401). More specifically, referring also to FIG. 3, the match results are provided on match lines ML and are stored as match values in corresponding match latches 320(1)-320($n$). The match values stored in the match latches 320 for the first flow are collectively referred to as the first state information. Thus, for embodiments in which CAM array 310 stores patterns embodied by an NFA, the logic values of the state information stored in match latches 320(1)-320($n$) indicate whether corresponding states of the NFA are active or inactive after processing the first search data.

Next, search data belonging to a second flow is received for processing in the search system (402). Because the second flow is different than the first flow, it is desirable to generate search results for the second flow that are independent of the first flow. Thus, before the second search data is searched for the patterns stored in the search engine 110, a flow switch operation is initiated to switch search operations from the first flow to the second flow (403), and then the first state information is saved into the external state memory (404). For some embodiments, flow control circuit 120 detects the change in flows and, in response thereto, asserts control signals CTR_FS and CTR_SSR to initiate the flow switch operation. Assertion of signal CTR_FS pauses search operations for the first flow and enables the state information to be read from the search engine. Assertion of signal CTR_SSR enables the state information read from the search engine to be saved in the external state memory 130.

Figure 4B:
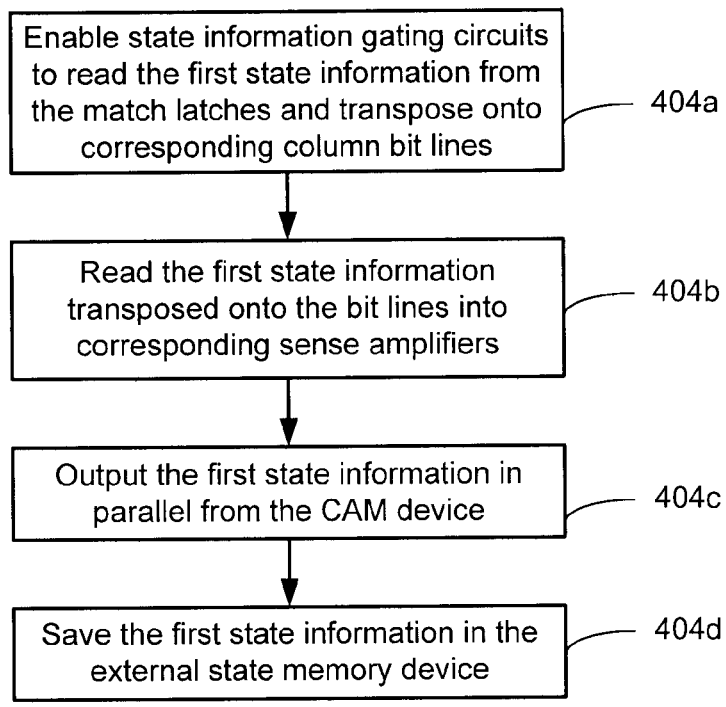
Figure 4C:
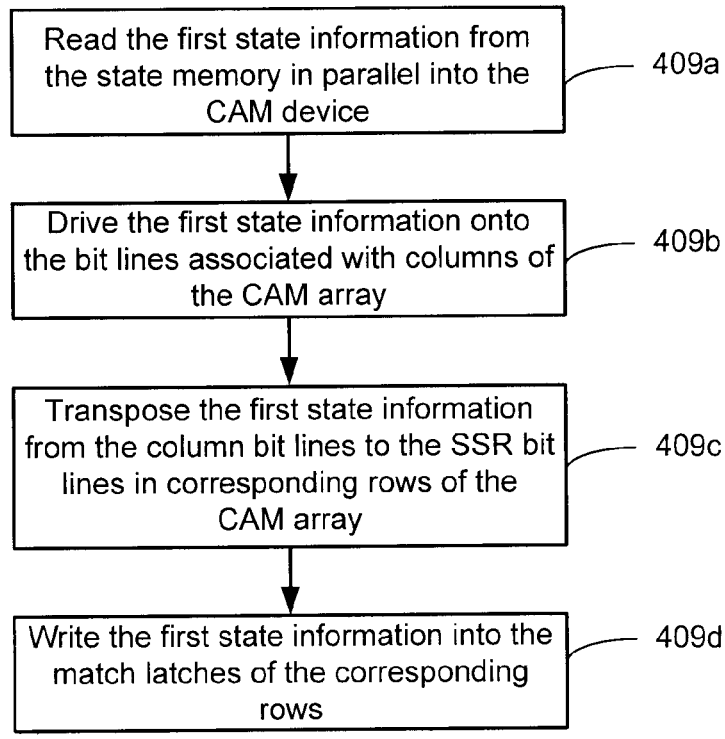

An exemplary operation for saving the first state information from the CAM device 300 into state memory 130 is depicted in FIG. 4B. First, the control signal SSR_EN is driven to a read state that allows gating circuits 330(1)-330(n) to read the first state information stored in the match latches 320(1)-320(n) and transpose the first state information in parallel onto the bit line pairs BL/$\overline{BL}$ in respective columns C1-Cn via corresponding signal line pairs BL_SSR/$\overline{BL\_SSR}$ (404a). For some embodiments, the control signal SSR_EN can be driven to a read state in response to assertion of CTR_FS by flow control circuit 120. After being transposed onto the bit line pairs BL/$\overline{BL}$, the first state information is then read in parallel by sense amplifiers within read/write circuit 240 (404b). Next, read/write circuit 240 outputs the first state information from the CAM device 300 to the external state memory 130 in parallel via state data line pairs SDL/$\overline{SDL}$ (404c), and the first state information is saved in the state memory 130 (404d). For some embodiments, write operations to the external state memory 130 can be controlled by the control signal CTR_SSR generated by flow control circuit 120.

Referring again to FIG. 4A, after the first state information is stored in state memory 130, the second flow search data is compared with data stored in the CAM array 310 to generate match results therein (405). As described above, the match results are provided on match lines ML and are stored as match values in corresponding match latches 320(1)-320(n). The match values stored in the match latches 320 for the second flow are collectively referred to as the second state information.

Next, additional search data belonging to the first flow is received for processing in the search engine (406). Before search operations for the first search data are resumed in the search engine, a flow switch operation is initiated to switch from the second flow back to the first flow (407). For some embodiments, flow control circuit 120 detects the change in flows and, in response thereto, asserts control signal CTR_FS to initiate the flow switch operation, which pauses search operations for the second flow and enables the second state information to be read from the search engine.

The second state information is saved into the external state memory 130 in the manner described above with respect to FIG. 4B (408). Then, the first state information previously stored in state memory 130 is restored to the CAM array so that search operations for the first flow can continue at the same point they were discontinued during the previous flow switch operation (409).

An exemplary operation for restoring the first state information to the CAM array 310 is described below with respect to the illustrative flow chart of FIG. 4C. First, the first state information is read from state memory 130 and provided to read/write circuit 240 of the CAM device in parallel via the state data line pairs SDL/$\overline{SDL}$ (409a). For some embodiments, read operations from state memory 130 can be controlled by the control signal CTR_SSR generated by flow control circuit 120. Next, write drivers within read/write circuit 240 drive the first state information received from the state data line pairs SDL/$\overline{SDL}$ onto the bit line pairs BL/$\overline{BL}$ of corresponding columns in the CAM array 310 (409b). The first state information is transposed in parallel from the bit line pairs BL/$\overline{BL}$ in columns of the CAM array to the SSR bit line pairs BL_SSR/$\overline{BL\_SSR}$ in corresponding rows of the CAM array 310 (409c). Then, the first state information is written into the match latches 320(1)-320(n) by corresponding state information gating circuits 330(1)-330(n), thereby restoring the first state information to the CAM array 310 in a parallel manner (409d). For some embodiments, the control signal SSR_EN can be driven to a write state in response to assertion of CTR_FS by flow control circuit 120 to enable the gating circuits 330(1)-330(n) to write the state information into respective match latches 320(1)-320(n).

Figure 5:
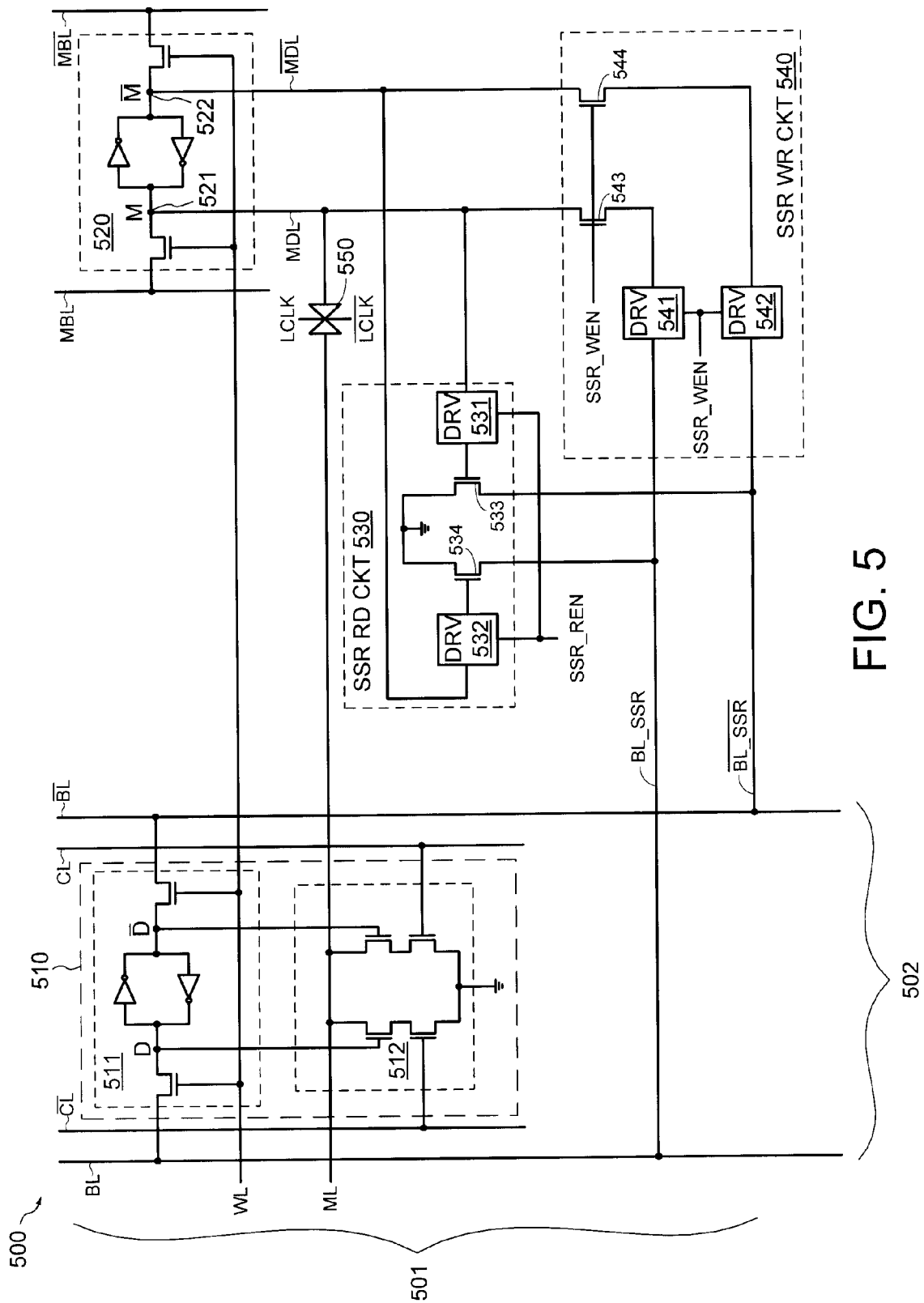
FIG. 5 shows a circuit diagram of a portion of one embodiment of the CAM array of FIG. 3.

FIG. 5 shows a more detailed portion 500 of CAM array 210 in accordance with some embodiments. CAM portion 500 includes a row 501 and a column 502. The row 501 includes a binary CAM cell 510, a match latch 520, an SSR read circuit 530, an SSR write circuit 540, and a well-known pass gate 550. For simplicity, only one CAM cell 510 is shown in FIG. 5, although for actual embodiments, CAM row 501 and CAM column 502 can include any suitable number of CAM cells. Further, CAM cell 510 is depicted in FIG. 5 as a well-known binary CAM cell for simplicity. However, for actual embodiments, CAM cell 510 can be any suitable type of CAM cells including, for example, ternary and quaternary CAM cells.

As shown in FIG. 5, CAM cell 510 includes an SRAM cell 511 and a compare circuit 512. SRAM cell 511, which is well-known, is coupled to a complementary bit line pair BL/$\overline{BL}$ associated with corresponding column 502 of the CAM array, and is coupled to a word line associated with the corresponding row 501. As known in the art, a data bit D is written to SRAM cell 511 by asserting the word line high (e.g., to VDD) and driving a value of D and its complement $\overline{D}$ on BL and $\overline{BL}$, respectively. Compare circuit 512, which is well-known, is coupled to SRAM cell 511, to a match line ML for the row 501, and to a complementary comparand line pair CL/$\overline{CL}$ associated with the corresponding column 502. Compare circuit 512 compares a comparand bit (e.g., a bit of the search key) with the data bit D stored in the cell 511, and indicates the match results on the match line ML. The match results on ML are provided to and stored in the match latch 520.

Match latch 520, which is one embodiment of match latch 320 of FIG. 3, is shown in FIG. 5 as a well-known SRAM cell that stores a match bit M and its complement $\overline{M}$ at nodes 521 and 522, respectively. Match latch 520 is coupled to the word line WL and coupled to a match bit line pair MBL/$\overline{MBL}$ to enable testing functions, as well as to enable conventional serial read and write operations. Node 521 of match latch 520 is selectively coupled to the row's match line ML by pass gate 550 in response to a latch clock signal LCLK, where LCLK and its complement $\overline{LCLK}$ are provided to complementary control terminals of pass gate 550. In this manner, during compare operations, the data node 521 of match latch 520 is driven to the logic state indicated on the match line ML by pass gate 550, which causes the complementary data node 522 of match latch 520 to be driven to the complementary logic state. Although not shown for simplicity, for some embodiments, a suitable well-known gating circuit can be provided on the match line ML to selectively de-couple the CAM cells 510 from the match latch 520 (e.g., during ML pre-charging operations).

In accordance with present embodiments, the match latch 520 in row 501 is coupled to the bit line pair BL/$\overline{BL}$ of column 502 via SSR bit line pair BL_SSR/$\overline{BL\_SSR}$ so that state information can be transferred between match latch 520 and the external state memory (not shown in FIG. 5 for simplicity) using the column's bit line pair. As described in more detail below, read operations from match latch 520 to the bit line pair BL/$\overline{BL}$ are facilitated by SSR read circuit 530 in response to an SSR read enable signal SSR_REN, and write operations from the bit line pair BL/$\overline{BL}$ to match latch 520 are facilitated by SSR write circuit 540 in response to an SSR write enable signal SSR_WEN. Together, SSR read circuit 530 and SSR write circuit 540 form one embodiment of state information gating circuits 330 of FIG. 3, and enable signals SSR_REN and SSR_WEN form one embodiment of control signal SSR_EN of FIG. 3.

More specifically, SSR read circuit 530 includes driver circuits 531-532 and NMOS transistors 533-534. NMOS transistor 533 is coupled between $\overline{BL\_SSR}$ and ground potential, and has a gate selectively coupled to data node 521 of match latch 520 by driver circuit 531 in response to SSR_REN. NMOS transistor 534 is coupled between BL_SSR and ground potential, and has a gate selectively coupled to complementary data node 522 of match latch 520 by driver circuit 532 in response to SSR_REN. To read state information from match latch 520 to the external state memory via bit line pair BL/$\overline{BL}$, the word line WL is de-asserted (e.g., to logic low) to isolate data stored in CAM cell 510 from the bit lines BL/$\overline{BL}$ during the read state information operation, the bit lines BL and $\overline{BL}$ are pre-charged (e.g., toward VDD), and SSR_REN is asserted (e.g., to logic high) to turn on driver circuits 531-532. Driver circuits 531 and 532 drive the gates of corresponding transistors 533 and 534 with the match bit M and the complementary match bit $\overline{M}$, respectively. In response thereto, transistors 533 and 534 pull respective signal lines $\overline{BL\_SSR}$ and BL_SSR to opposite logic states, which in turn drive respective signal lines $\overline{BL}$ and BL to opposite logic states to achieve a differential voltage indicative of the state information stored in the match latch 520. In this manner, the state information is transposed from row 501 of the CAM array to column 502 of the CAM array, thereby facilitating the parallel reading of state information from a number N of rows to the external state memory via a corresponding number N of columns.

For example, if M=1 and $\overline{M}$=0, then driver circuit 531 drives the gate of transistor 533 to logic high (e.g., toward VDD) and driver circuit 532 drives the gate of transistor 534 to logic low (e.g., toward ground potential). In response thereto, transistor 533 turns on and pulls $\overline{BL\_SSR}$ and $\overline{BL}$ to logic low, and transistor 534 turns off and does not discharge BL_SSR or BL. In this manner, BL remains in its pre-charged logic high state and $\overline{BL}$ is discharged to logic low, thereby creating a differential voltage between BL and $\overline{BL}$ representative of the M=1 value stored in the match latch 520. Conversely, if M=0 and $\overline{M}$=1, then driver circuit 531 drives the gate of transistor 533 to logic low and driver circuit 532 drives the gate of transistor 534 to logic high. In response thereto, transistor 533 turns off and does not discharge $\overline{BL\_SSR}$ or $\overline{BL}$, and transistor 534 turns on and discharges BL_SSR and BL. In this manner, BL is discharged to logic low and $\overline{BL}$ remains in its pre-charged logic high state, thereby creating a differential voltage between BL and $\overline{BL}$ representative of the M=0 value stored in the match latch 520.

SSR write circuit 540 includes driver circuits 541-542 and NMOS transistors 543-544. NMOS transistor 543 is selectively coupled between BL_SSR and data node 521 of match latch 520 by driver circuit 541 in response to SSR_WEN. NMOS transistor 544 is selectively coupled between $\overline{BL\_SSR}$ and complementary data node 522 of match latch 520 by driver circuit 542 in response to SSR_WEN. To write state information from the external memory to the match latch 520 via bit line pair BL/$\overline{BL}$, the word line WL is de-asserted (e.g., to logic low) to isolate data stored in CAM cell 510 from the bit lines BL/$\overline{BL}$ during the write state information operation, the bit lines BL and $\overline{BL}$ are driven to a differential voltage indicative of the match value M to be written to match latch 520 by read/write circuit 240, and SSR_WEN is asserted (e.g., to logic high) to turn on driver circuits 541-542 and to turn on NMOS transistors 543-544. Thereafter, driver circuit 541 drives the logic value provided on BL to data node 521 of match latch 520 via BL_SSR, and driver circuit 542 drives the logic value provided on $\overline{BL}$ to complementary data node 522 of match latch 520 via $\overline{BL\_SSR}$. In this manner, the state information read from the external state memory into the CAM array is transposed from column 502 of the CAM array to row 501 of the CAM array, thereby facilitating the parallel writing of state information into a number N of rows of match latches 520 from a corresponding number N of columns of the array.

For example, to write a logic high match value (M=1) from the external state memory into the match latch 520, the write drivers within read/write circuit 240 (see also FIG. 3) drive BL to logic high and drive $\overline{BL}$ to logic low. The logic high value on BL is transposed onto BL_SSR, and in response thereto, driver circuit 541 drives data node 521 to logic high (e.g., to VDD) to store M=1 in match latch 520. The logic low value on $\overline{BL}$ is transposed onto $\overline{BL\_SSR}$, and in response thereto, driver circuit 542 drives complementary data node 522 to logic low (e.g., to ground potential) to store $\overline{M}$=0 in match latch 520. Conversely, to write a logic low match value (M=0) from the external state memory into the match latch 520, the write drivers within read/write circuit 240 drive BL to logic low and drive $\overline{BL}$ to logic high. The logic low value on BL is transposed onto BL_SSR, and in response thereto, driver circuit 541 drives data node 521 to logic low (e.g., to ground potential) to store M=0 in match latch 520. The logic high value on $\overline{BL}$ is transposed onto $\overline{BL\_SSR}$, and in response thereto, driver circuit 542 drives complementary data node 522 to logic high (e.g., to VDD) to store $\overline{M}$=1 in match latch 520.

Note that when SSR read circuit 530 is not being used to transfer state information from match latch 520 to the external memory via the array's bit lines, the signal SSR_REN is de-asserted to isolate match latch 520 from the bit lines. Similarly, when SSR write circuit 540 is not being used to transfer state information to match latch 520 from the external memory via the array's bit lines, the signal SSR_WEN is de-asserted to isolate match latch 520 from the bit lines.

Figure 6A:
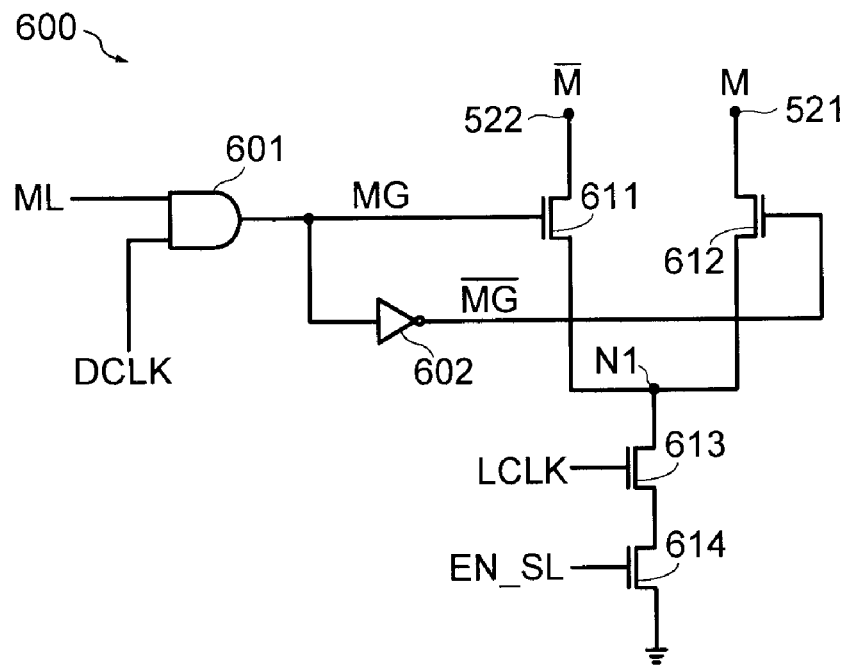
FIG. 6A shows a circuit diagram of one embodiment of the pass gate of FIG. 5.

FIG. 6A shows a pass gate 600 that is one embodiment of pass gate 550 of FIG. 5. Pass gate 600 includes an AND gate 601, a CMOS inverter 602, and NMOS transistors 611-614. Referring also to FIG. 5, the AND gate 601 includes a first input coupled to the match line ML, a second input to receive a data clock signal DCLK, and an output to generate a gated match signal MG. Transistor 611 is coupled between node 522 of match latch 520 and an intermediate pass gate node N1, and has a gate to receive the gated match signal MG. Transistor 612 is coupled between node 521 of match latch 520 and intermediate pass gate node N1, and has a gate to receive a complemented gated match signal $\overline{MG}$ generated in response to MG by the CMOS inverter 602. Transistors 613 and 614 are coupled between intermediate node N1 and ground potential, and have gates to receive LCLK and a state latch enable signal EN_SL, respectively. For other embodiments, transistor 614 can be omitted.

Pass gate 600 transfers the match signal on the match line ML to the match latch 520 as follows. Prior to compare operations in row 500, DCLK is de-asserted, which causes AND gate 601 to isolate the match line ML from the match latch 520. Further, LCLK and EN_SL are de-asserted to turn off respective transistors 613 and 614, thereby isolating the match latch 520 from ground potential. Once the match results are generated on the match line ML, DCLK is asserted to enable the AND gate 601 to output the match signal on ML as the gated match signal MG, and LCLK and EN_SL are asserted to turn on transistors 613 and 614. For example, if the match signal is logic high (e.g., indicating a match condition), the AND gate 601 drives MG to logic high, and in response thereto CMOS inverter 602 drives $\overline{MG}$ to logic low. The logic high state of MG turns on transistor 611, which in turn pulls node 522 of match latch 520 low toward ground potential through transistors 613 and 614. In this manner, $\overline{M}$ is driven to logic low, which in turn drives node 521 to logic high, thereby storing M=1 in the match latch. The logic low state of $\overline{MG}$ turns off transistor 612 and isolates node 521 of the match latch 520 from ground potential. Conversely, if the match signal is logic low (e.g., indicating a mismatch condition), the AND gate 601 drives MG to logic low, and in response thereto CMOS inverter 602 drives $\overline{MG}$ to logic high. The logic high state of $\overline{MG}$ turns on transistor 612, which in turn pulls node 521 of match latch 520 low toward ground potential through transistors 613 and 614. In this manner, M is driven to logic low, which in turn drives node 522 to logic high, thereby storing M=0 in the match latch. The logic low state of MG turns off transistor 611 and isolates node 522 of the match latch 520 from ground potential.

Figure 6B:
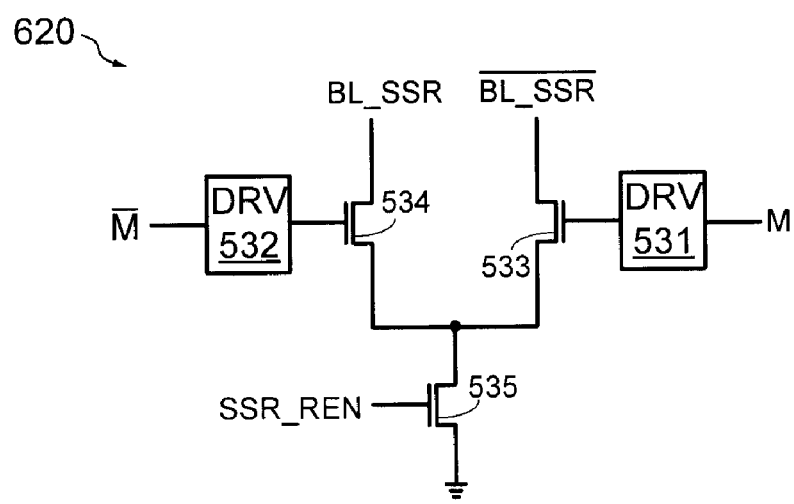
FIG. 6B shows another embodiment of the save state and restore read (SSR) circuit of FIG. 5.

FIG. 6B shows an SSR read circuit 620 that is another embodiment of SSR read circuit 530 of FIG. 5. SSR read circuit 620 includes all the elements of SSR read circuit 530, and an additional NMOS transistor 535 coupled between the drains of NMOS transistors 533-534 and ground potential. Transistor 535, which has a gate to receive the control signal SSR_REN, provides isolation between 533-534 and ground potential.

Figure 7A:
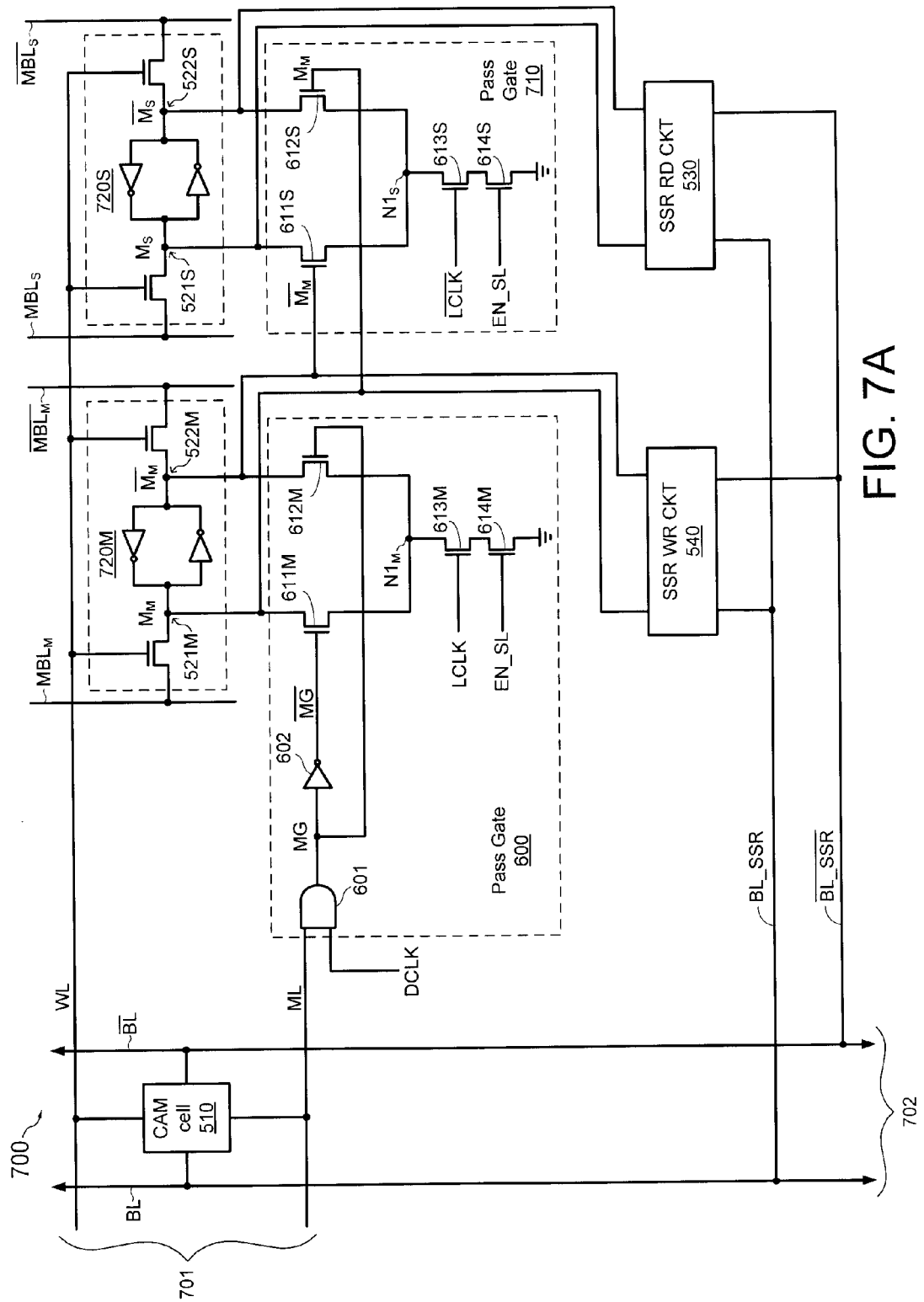
FIG. 7A shows a circuit diagram of a portion of another embodiment of the CAM array of FIG. 3.

FIG. 7A shows a more detailed portion 700 of CAM array 210 in accordance with some embodiments. CAM portion 700 includes a row 701 and a column 702. The row 701 includes CAM cell 510, a master match latch 720M, a slave match latch 720S, SSR read circuit 530, SSR write circuit 540, and pass gate 600 (see also FIG. 6A). CAM row 701 is similar to CAM row 501 of FIG. 5, except that match latch 520 is replaced by master/slave match latches 720M and 720S, which together form a flip-flop that is another embodiment of match latch 320 of FIG. 3. The flip-flop can store the match results for the corresponding CAM row for a full clock cycle (e.g., as opposed to a single latch that stores the results for only one phase of the clock signal), and therefore the match latches discussed above with respect to the exemplary embodiments FIGS. 3 and 5 are typically implemented as flip-flops in the manner depicted in FIG. 7A. Master match latch 720M stores a master match bit $M_M$ at its node 521M and stores the complement $\overline{M_M}$ at its node 522M, and slave match latch 720S stores a slave match bit $M_S$ at its node 521S and the complement $\overline{M_s}$ at its node 522S. In this manner, the master match latch 720M stores the initial match state information, and the slave match latch 720S stores the final match state information.

The individual configuration and operation of master match latch 720M and slave match latch 720S are similar to that described above with respect to match latch 520 of FIG. 5, except that master match latch 720M is connected directly to SSR write circuit 540, and slave match latch 720S is connected directly to SSR read circuit 530. As a result, state information can be restored from external memory 130 to master match latch 720M via SSR write circuit 540, and state information can be saved to external memory 130 from slave match latch 720S via SSR read circuit 530, as described in more detail below.

For simplicity, only one CAM cell 510 is shown in FIG. 7A, although for actual embodiments, CAM row 701 and CAM column 702 can include any suitable number of CAM cells. As mentioned above with respect to FIG. 5, CAM cell 510 can be any suitable type of CAM cell including, for example, binary, ternary and/or quaternary CAM cell.

As shown in FIG. 7A, the master match latch 720M is coupled to the pass gate 600 in the manner described above with respect to FIG. 6A, and is also coupled to the slave match latch 720S. More specifically, node 521M of master match latch 720M is coupled to the gate of transistor 612S, and node 522M of master match latch 720M is coupled to the gate of transistor 611S so that the match bit $M_M$ stored in the master match latch 720M can be transferred to and stored in the slave match latch 720S as $\overline{M_s}$ in response to the complemented latch clock signal $\overline{LCLK}$ provided to the gate of transistor 613S. Together, transistors 611S-614S form a pass gate 710 that selectively transfers the match data $M_M$ stored in the master match latch 720M to the slave match latch 720S in response to $\overline{LCLK}$.

During compare operations, the match results generated on the match line ML are first driven into the master match latch 720M during a first phase of LCLK, and are then transferred to the slave match latch 720S during a second phase of LCLK. More specifically, after match results are generated on the match line ML in response to compare operations in the CAM cells 510, DCLK is asserted and allows pass gate 600 to drive the resulting match signal on the match line ML as the match bit $M_M$ into master match latch 720M in response to a triggering edge of LCLK (e.g., in the manner described above with respect to FIG. 6A). Then, in response to the triggering edge of $\overline{LCLK}$, which for some embodiments is 180 degrees out of phase with respect to LCLK, transistor 613S turns on and allows the match bit $M_M$ stored in master match latch 720M to be driven into the slave match latch 720S as the match bit $M_S$, thereby transferring the match bit from the master match latch 720M to the slave match latch 720S one-half cycle after the match results are stored in the master match latch 720M.

Then, during flow switch operations, the master match latch 720M and the slave match latch 720S can be separately used to write state information into the CAM row 700 and to read state information from the CAM row 700, respectively. More specifically, to read state information from CAM row 700 to the external memory 130, the complementary match bits $M_S$ and $\overline{M}_s$ are provided from slave match latch 720S to SSR read circuit 530, which in turn drives the match bit onto the bit line pair BL/$\overline{BL}$ via the SSR bit line pair BL_SSR/$\overline{BL\_SSR}$ in response to SSR_REN, as described above with respect to FIG. 5. To restore state information from the external memory 130 to the CAM row 700, the bit lines BL and $\overline{BL}$ are driven to a differential voltage indicative of the externally stored match value M by read/write circuit 240, and SSR_WEN is asserted to enable SSR write circuit 540 to write the match value received from the bit line pair BL/$\overline{BL}$ via the SSR bit line pair BL_SSR/$\overline{BL\_SSR}$ to the master match latch 720M.

Figure 7B:
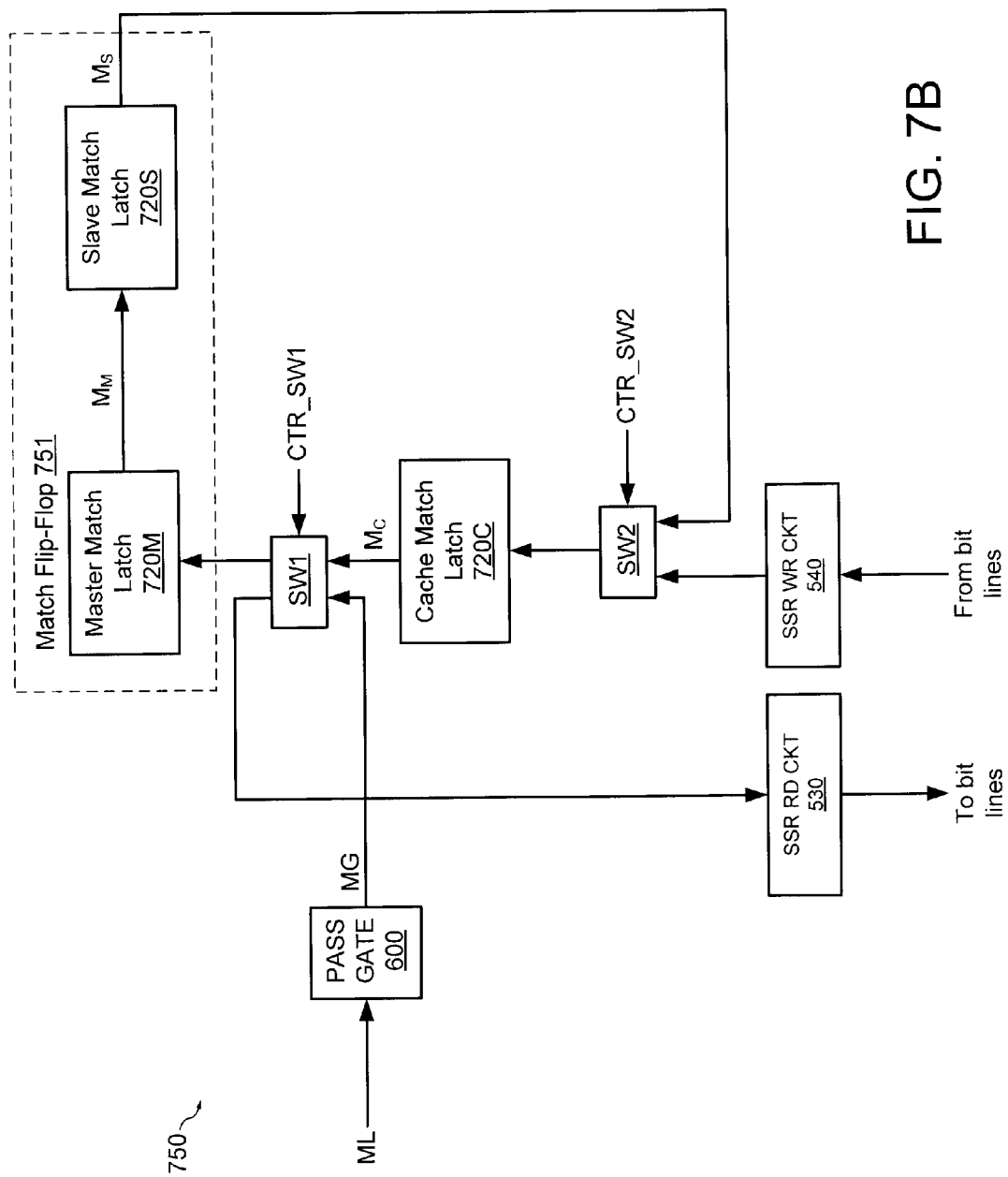
FIG. 7B shows a functional block diagram of a portion of yet another embodiment of the CAM array of FIG. 3.

For another embodiment, an additional latch (e.g., SRAM cell) can be added to each CAM row and used as a cache memory to facilitate the transfer of state information between the CAM array and the external state memory 130 in a manner that virtually eliminates array down-time associated with flow switch operations. For example, FIG. 7B shows a simplified functional block diagram of a portion 750 of a CAM row that is a modified embodiment of CAM row 700 of FIG. 7A. CAM row 750 is shown to include pass gate 600, SSR read circuit 530, SSR write circuit 540, master match latch 720M, and slave match latch 720S of CAM row 700, and additionally includes a cache match latch 720C and switches SW1-SW2. Together, master match latch 720M and slave match latch 720S form a match flip-flop 751. Pass gate 600 has an input to receive the match results from the match line ML, and includes an output to provide the gated match signal MG to a first input of switch SW1, which includes a second input to receive a cached match signal $M_C$ from cache match latch 720C, a first output coupled to master match latch 720M, a second output coupled to SSR read circuit 530, and a control terminal to receive a corresponding first switch control signal CTR_SW1. The output of master match latch 720M provides the latched match bit $M_M$ to slave match latch 720S, which in turn has an output coupled to a first input of switch SW2. The second switch SW2 includes a second coupled to the output of SSR write circuit 540, an output coupled to an input of cache match latch 720C, and a control terminal to receive a corresponding second switch control signal CTR_SW2. For simplicity, the CAM cell 510, bit line pairs, and SSR bit line pair associated with row 750 are not shown in FIG. 7B.

Figure 8:
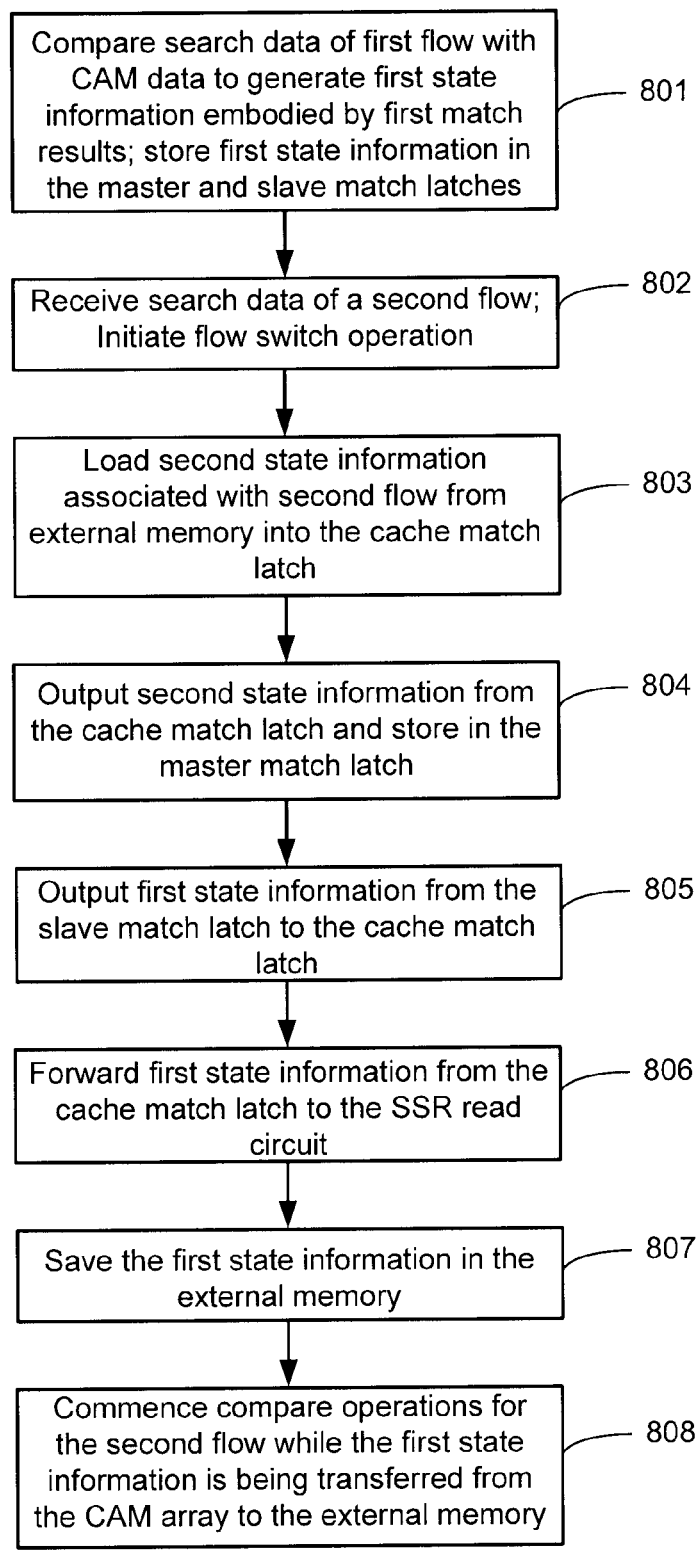
FIG. 8 is an illustrative flow chart depicting an exemplary flow switch operation in accordance with one embodiment of the CAM row of FIG. 7B.

An exemplary flow switch operation of CAM row 750 is described below with respect to the illustrative flow chart of FIG. 8. First, search data associated with a first flow F1 are compared with data stored in the CAM array to generate match results that will be stored in the match latch (801). More specifically, the match results are gated by pass gate 600 and then latched in master match latch 720M, and then forwarded to and latched in the slave match latch 720S. While the compare operation for F1 is performed, the flow control circuit 120 receives search data associated with the second flow F2, and initiates a flow switch operation (802). In response thereto, state information associated with the second flow F2 and previously stored in the external memory 130 is loaded into the CAM array and written into the cache match latch 720C by the SSR write circuit 540 (803). The signal CTR_SW2 is set to a state that causes SW2 to forward the F2 state information from SSR write circuit 540 to cache match latch 720C.

When the compare operation for F1 completes and the resulting F1 state information is stored in the master and slave match latches, the first switch SW1 routes the F2 state information from the cache match latch 720C as $M_C$ to master match latch 720M for storage therein (804). In this manner, the F2 state information is restored to the master match latch 720M immediately after the F1 compare operation completes. Then, in a next clock cycle, the F1 state information stored in the slave match latch 720S is routed to the cache match latch 720C via the second switch SW2 under the control of CTR_SW2 (805). Next, the F1 state information stored in the cache match latch 720C is routed via the first switch SW1 (under control of CTR_SW1) to the SSR read circuit 530 (806), which in turn saves the F1 state information in the external memory 130 (807). While the F1 state information is being saved in the external memory 130, compare operations for the second flow F2 can be commenced using the F2 state information restored to the master match latch 720M (808). In this manner, compare operations for the second flow F2 can be started while the F1 state information is being transferred to the external memory 130, thereby minimizing array downtime during flow switch operations by performing state information transfers while compare operations are being performed. In other words, including the cache match latch 720C in each CAM row allows compare operations in the CAM array to continue uninterrupted while state information for different flows is exchanged between the CAM array and the external memory 130.

As mentioned, the exemplary CAM array 310 depicted in FIG. 3 includes the same number of rows and columns, and therefore there is a one-to-one correspondence between the bit line pairs BL/$\overline{BL}$ in columns of the array and the SSR bit line pairs BL_SSR/$\overline{BL\_SSR}$ in rows of the array that allows state information stored in rows of the CAM array (e.g., in match latches 320(1)-320(n)) to be simultaneously transposed onto columns of the CAM array and read from the array via the bit line pairs BL/$\overline{BL}$ in parallel in a single operation. However, actual embodiments of CAM array 210 of FIG. 2 typically a much greater number of rows than columns. For such embodiments, the bit line pair BL/$\overline{BL}$ in each column is selectively coupled to a plurality of different rows via gating circuits 330 so that match information can be transferred between the external state memory 130 and a number Z of row groups in Z successive operations. For example, in one exemplary embodiment of CAM array 210 that includes X=256 rows and Y=64 columns, the rows of the array are grouped into Z=X/Y=4 groups of 64 rows. Within each row group, each of the 64 rows is coupled to a corresponding one of the 64 columns via the SSR bit lines and gating circuits 330. During save state and restore operations, data is transferred in parallel between the external state memory and a selected group of 64 rows using the bit lines corresponding to the 64 columns.

Figure 9:
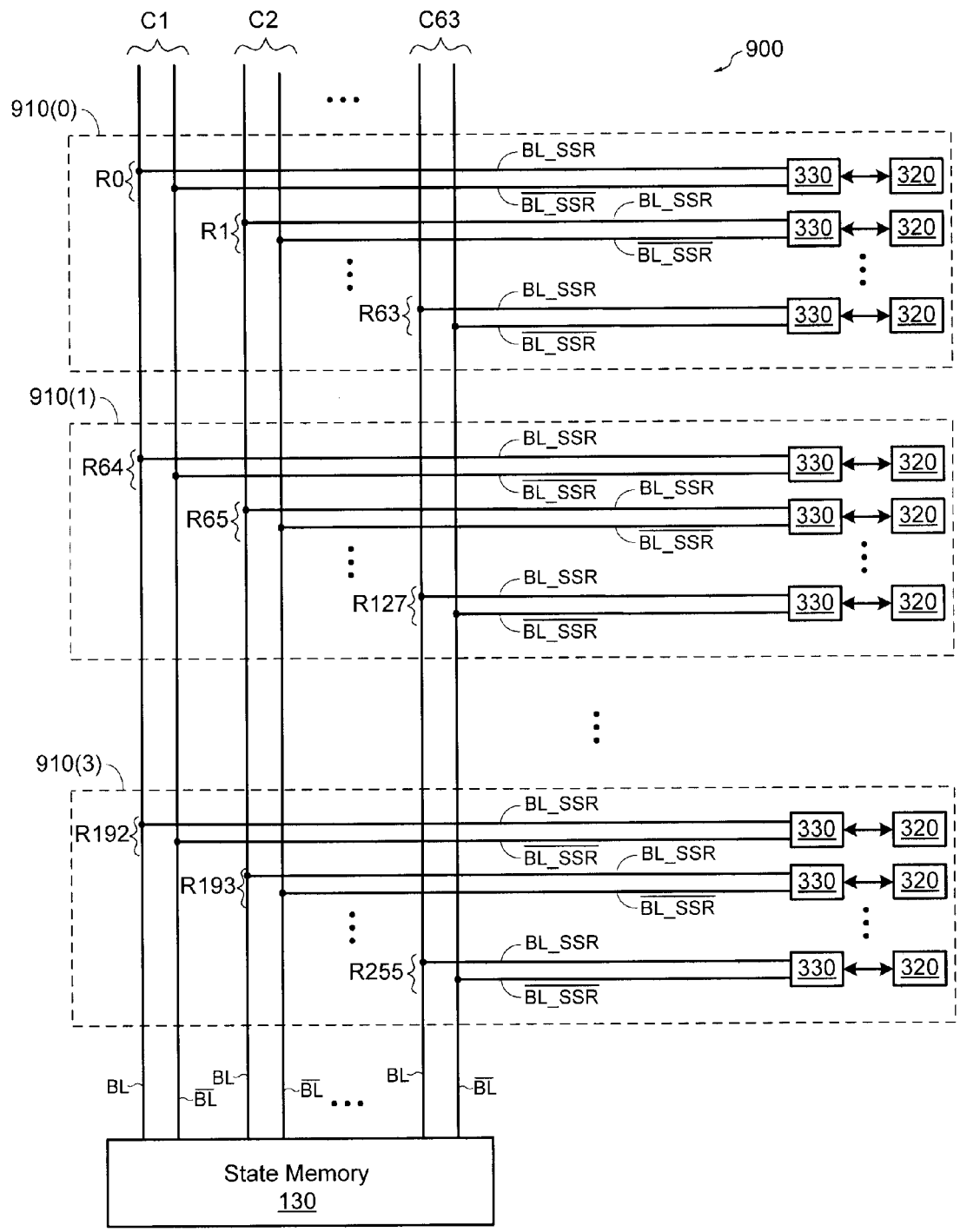
FIG. 9 shows a simplified block diagram of another embodiment of the CAM array of FIG. 2.

FIG. 9 depicts the multiplexed interconnections between the rows and columns of such an exemplary embodiment. CAM block 900, which is one embodiment of CAM array 210 of FIG. 2, includes X=256 rows R0-R255 and Y=64 columns C0-C63, wherein the rows are grouped into Z=X/Y=256/64=4 row groups 910(0)-910(3). Thus, the first row group 910(0) includes the first 64 rows R0-R63, the second row group 910(1) includes the second 64 rows R64-R127, and so on, where the last row group 910(3) includes the last 64 rows R192-R255. For simplicity, the CAM cells, word lines WL, comparand lines CL, match lines ML, comparand register 230, and read/write circuit 240 are not shown in FIG. 9. For the exemplary embodiment of FIG. 9, state information can be transferred between CAM block 900 and the external state memory 130 in 4 transfer cycles, where each transfer cycle facilitates the parallel transfer of state information between the state memory 130 and the 64 rows of a corresponding row group 910 via the bit line pairs in the 64 columns C0-C63. Each of row groups 910(0)-910(3) can be selected for state information transfers by selectively asserting the SSR enable signals (e.g., SSR_WEN and SSR_REN) provided to the gating circuits within the row group. For some embodiments, the SSR enable signals can be multiplexed to selectively enable state information transfers for each row group 910.

The present embodiments described above allow a search engine to save and restore state information to and from an external state memory when switching between multiple flows faster than conventional approaches by transferring the state information between the search engine and the external state memory in a parallel manner. For CAM-based search engines configured according to present embodiments, the state information gating circuits selectively allow state information to be transferred between the CAM array's match latches and the external memory during save-state and restore (SSR) operations via the CAM array's bit lines, thereby advantageously utilizing existing CAM array components (e.g., bit lines, sense amplifiers, and write drivers) to quickly transfer state information between the CAM array and the external state memory. As described above, the state information, which is generated as match results and stored in the match latches in response to compare operations performed in the CAM array, can be indicative of corresponding states of one or more NFAs embodied by data stored in the CAM array.

For the embodiments described above, the match information generated in the CAM array is stored as such into the external state memory during flow switch operations, and therefore the external state memory typically includes a number of storage elements similar to the number of match latches provided in the CAM array. For other embodiments, the match information can be stored in external memory as highest-priority match (HPM) addresses that indicate which rows of the CAM array have a match condition (e.g., an active match or state bit). Storing the HPM addresses in the external memory, rather than storing all the state information as a state vector, can reduce the amount of storage area used by the external memory. Thus, for other embodiments, SSR processing circuitry can be provided between the CAM device and the external memory device to translate (e.g., encode) state information generated during CAM compare operations into HPM addresses for storage in the external memory, and to translate (e.g., decode) HPM addresses read from the external memory into state information for loading back into the CAM array.

Figure 10:
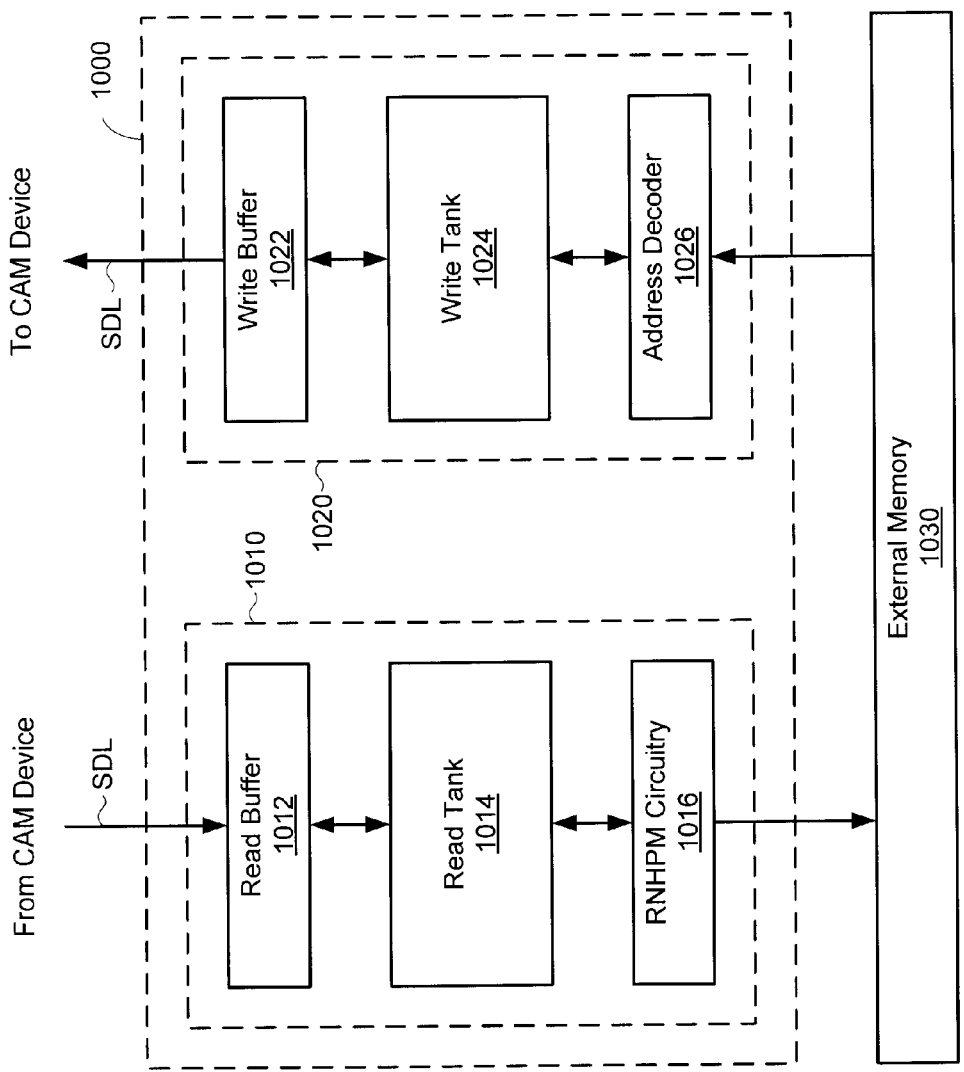
FIG. 10 shows a block diagram of SSR processing circuitry in accordance with some of the present embodiments.

For example, FIG. 10 shows a block diagram of SSR processing circuitry configured in accordance with some embodiments. SSR processing circuitry 1000, which is coupled between the CAM device and an external memory 1030 via the state data lines SDL, includes save state circuitry 1010 and restore state circuitry 1020. External memory 1030 can be any suitable type of memory device or circuit. For some embodiments, memory device 1030 is a DRAM, although for alternate embodiments memory device 1030 can be a Flash memory, EPROM, EEPROM, SRAM, or other suitable type of memory device.

In general, during a save state phase of an SSR operation in which state information associated with a flow being switched out of the CAM device is saved in the external memory, save state circuitry 1010 receives state information (e.g., match results) read from the CAM device, processes the state information to generate a number of associated HPM addresses, and then forwards the HPM address information to the external memory 1030 for storage therein. Then, during a restore state phase of the SSR operation in which state information associated with the flow being switched back into the CAM device is restored to the CAM device, restore state circuit 1020 retrieves the HPM address information from external memory 1030, processes the HPM address information to re-generate the state information originally received from the CAM device, and then forwards the state information to the CAM device for loading back into the CAM array's match latches.

More specifically, the save state circuitry 1010 is shown in FIG. 10 to include a read buffer 1012, a read tank 1014, and read-next-highest-priority-match (RNHPM) circuitry 1016. The read buffer 1012, which can be any suitable type of FIFO memory device, includes inputs to receive a set of state information read from the CAM device via the SDL lines, and includes outputs coupled to the read tank 1014. Read tank 1014, which can be any suitable type of memory array, includes a plurality of rows of memory cells (not shown for simplicity) to store a plurality of sets of state information provided from the CAM device by the read buffer 1012. The RNHPM circuitry 1016 includes inputs coupled to the read tank 1014, includes outputs coupled to the external memory 1030, and is configured to generate the HPM addresses associated with the state information stored in the read tank 1014.

The restore state circuitry 1020 is shown in FIG. 10 to include a write buffer 1022, a write tank 1024, and an address decoder 1026. The address decoder 1026, which can be any suitable address decoder, includes inputs coupled to the external memory 1030 and includes outputs coupled to the write tank 1024. The write tank 1024, which can be any suitable type of memory array, includes a plurality of rows of memory cells (not shown for simplicity) to store a plurality of decoded addresses generated by the address decoder 1026. The write buffer 1022, which can be any suitable type of FIFO memory device, includes inputs to receive a set of decoded addresses from the write tank 1024 and includes outputs coupled to the CAM device via the SDL lines.

Referring also to FIGS. 3 and 9, during save state operations, state information stored as match results in the match latches 320 in each group 910 of CAM rows is sequentially read in parallel from the CAM array by read/write circuit 240 and provided in parallel from the CAM device to the read buffer 1012 via the SDL lines as a state information set. The read buffer 1012 sequentially loads each set of state information received from the CAM device into a corresponding row of the read tank 1014 until all the state information stored in the CAM array is saved in the read tank 1014. In this manner, each row of the read tank 1014 stores the state information for a corresponding group of CAM rows in the CAM device. Then, the RNHPM circuitry 1016 performs priority encoding operations on the state information stored in the read tank 1014 to generate an index or address for each CAM row that stores an active state bit (e.g., for each CAM row that indicates a match condition, which as described above can be used to indicate an active state for an associated NFA stored in the CAM array). The RNHPM circuitry 1016 outputs the encoded match addresses to the external memory 1030 for storage therein. For some embodiments, the match addresses are stored in the external memory 1030 according to priority (e.g., with the highest-priority CAM row addresses stored in the lowest addresses of the external memory 1030). Also, for some embodiments, the contents of the read buffer 1012 can be compressed to optimize the storage capacity of external memory 1030. Note that the RNHPM circuitry 1016 can generate the match addresses for some rows of the read tank 1014 at the same time that state information is written to other rows of the read tank 1014.

Then, during restore state operations, the address decoder 1026 sequentially retrieves the match addresses stored in the external memory 1030, decodes each match address to re-create a corresponding set of state information, and then loads the resulting set of state information into a corresponding row of the write tank 1024. In this manner, the address decoder 1026 recreates the state information as it was originally received from the CAM device during the save state operation, and stores the recreated state information in the write tank 1024 for loading back to the CAM array's match latches to restore the flow back into the CAM device. For some embodiments, the address decoder 1026 retrieves the match addresses from the external memory 1030 in the same order in which they were stored therein by the RNHPM circuitry 1016 (e.g., according to their priority). Then, the sets of recreated state information are sequentially loaded from corresponding rows of the write tank 1024 into the write buffer 1022, which in turn sequentially provides the sets of recreated state information to the CAM device in parallel via the SDL lines. In response thereto, read/write circuit 240 sequentially writes the sets of state information back into the match latches of corresponding CAM row groups in the CAM array, for example, in the manner described above with respect to FIGS. 3 and 9.

Employing SSR processing circuitry 1000 to externally process state information for the CAM device during flow switch operations provides several advantages. First, because the SSR processing circuitry 1000 can actively process (e.g., prioritize and encode) state information associated with an out-going flow F1 at the same time the CAM device is processing (e.g., searching) an incoming flow F2, latencies associated with generating the HPM addresses for the flow F1 state information are overlapped with CAM search operation for the flow F2, thereby minimizing array down-time associated with flow switch operations. Further, by encoding the state information as a set of HPM addresses, the amount of memory area needed to store the state information in external memory 1030 is reduced, for example, as compared to approaches that store un-encoded state information or state vectors in the external memory 1030. In addition, state information associated with one flow can be loaded into save state circuitry 1010 for subsequent storage in external memory 1030 at the same time that state information associated with another flow is retrieved from external memory 1030 by the restore state circuitry 1020 for subsequent restoration to the CAM device. Moreover, for some embodiments, restore state circuitry 1020 can reduce the time required to restore state information from external memory 1030 to the CAM device by activating only selected groups of match latches to receive state information from the SSR processing circuitry, as described in more detail below. Accordingly, the SSR processing circuitry 1000 allows an associated search engine (e.g., the CAM device) to switch between multiple flows with little or no array down-time.

Figure 11:
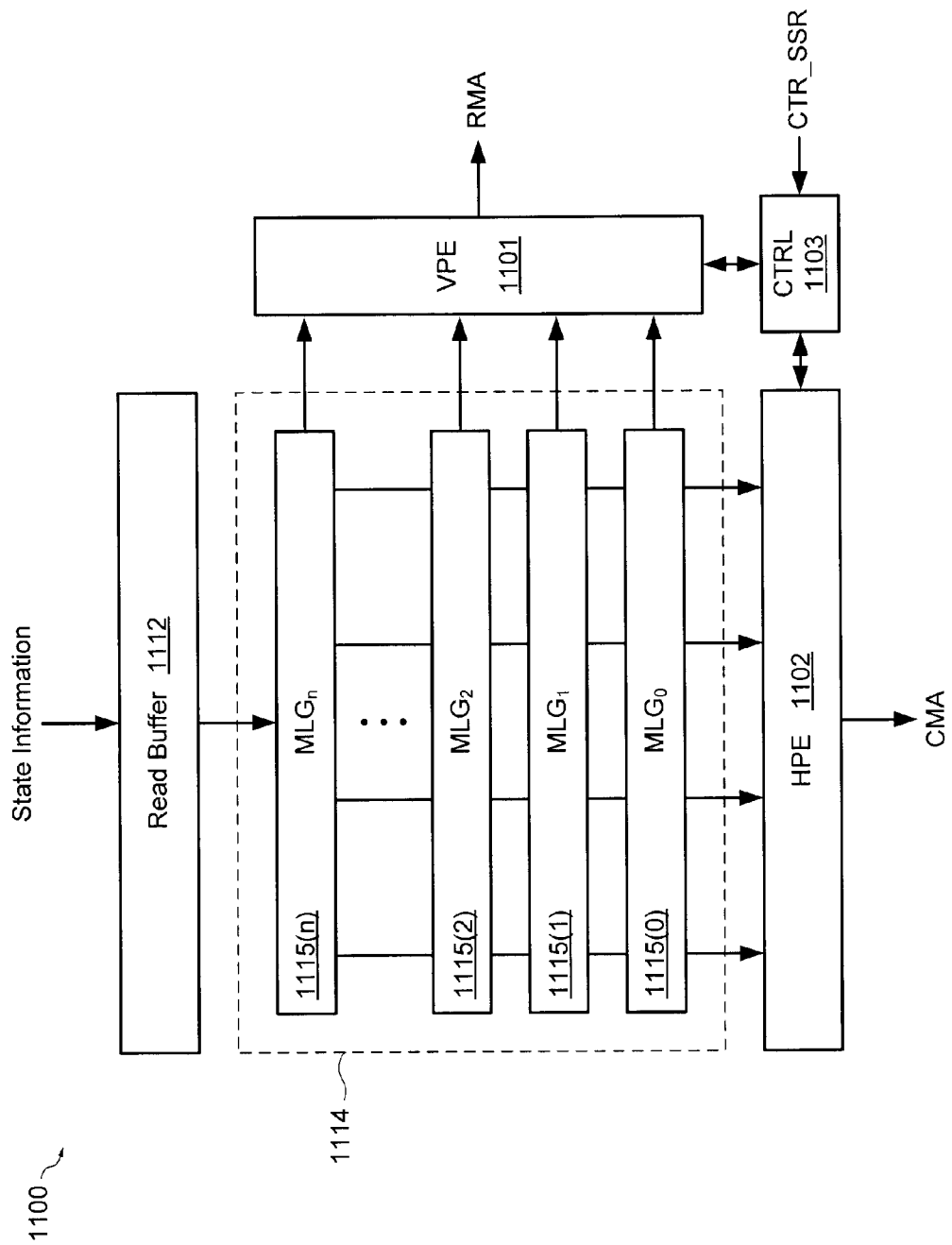
FIG. 11 shows a block diagram of one embodiment of the save state circuitry of FIG. 10.

FIG. 11 shows a block diagram of save state circuitry 1100 that is one embodiment of the save state circuitry 1010 of FIG. 10. Save state circuitry 1100 includes a read buffer 1112, a read tank 1114, a vertical priority encoder (VPE) 1101, a horizontal priority encoder (HPE) 1102, and a control circuit 1103 that controls operation of the save state circuitry 1100. Read buffer 1112 temporarily stores and provides state information received from the CAM device to the read tank 1114. Read tank 1114 includes an array of memory cells (not shown for simplicity) arranged in a number of rows and columns. Each row 1115 of memory cells is configured to store state information received from the match latches of a corresponding CAM row group (i.e., from a corresponding match latch group (MLG) of the CAM array). Thus, for some embodiments, the number of memory cells in each of rows 1115(0)-1115(n), and thus the number of columns within the array of read tank 1114, is the same as the number of CAM rows within each row group of the CAM array. For example, if the associated search engine is the CAM device 900 depicted in FIG. 9 (which includes X=256 rows R0-R255 and Y=64 columns C0-C63, wherein the rows are grouped into Z=X/Y=256/64=4 row groups 910(0)-910(3)), then one embodiment of the read tank 1114 can include Z=4 rows and Y=64 columns of memory cells, with each row 1115 storing the state information provided from the match latches 320 in a corresponding group 910 of 64 columns.

The VPE 1101 includes inputs connected to the rows 1115 of read tank 1114, and is configured to determine which of the rows, if any, store active state bits (e.g., match bits indicating a match condition). Each row of read tank 1114 that stores at least one active state bit is hereinafter referred to as an "active row." For each active row in the read tank 1114, the VPE 1101 generates the corresponding row match address (RMA), which for some embodiments identifies which CAM row group the active state information is associated with.

The HPE 1102 includes inputs connected to the columns of read tank 1114, and is configured to determine which columns (e.g., which memory cells) in each active row store active state bits. For each column of read tank 1114 that contains active state bits, the HPE 1102 generates the corresponding column match address CMA, which for some embodiments identifies which row in the selected CAM row group stores the active state bits. Together, the VPE 1101 and the HPE 1102 form one embodiment of the RNHPM circuitry 1016 of FIG. 10.

For some embodiments, the VPE 1101 "selects" the active rows so that the HPE 1102 performs column encoding operations only on the rows that store active state bits. For example, if row 1115(1) of read tank 1114 associated with MLG$_1$ does not contain an active state bit, then the HPE 1102 does not perform priority encoding on that particular row. This allows for faster and more efficient encoding of the state information stored in the read tank 1114.

Figure 12:
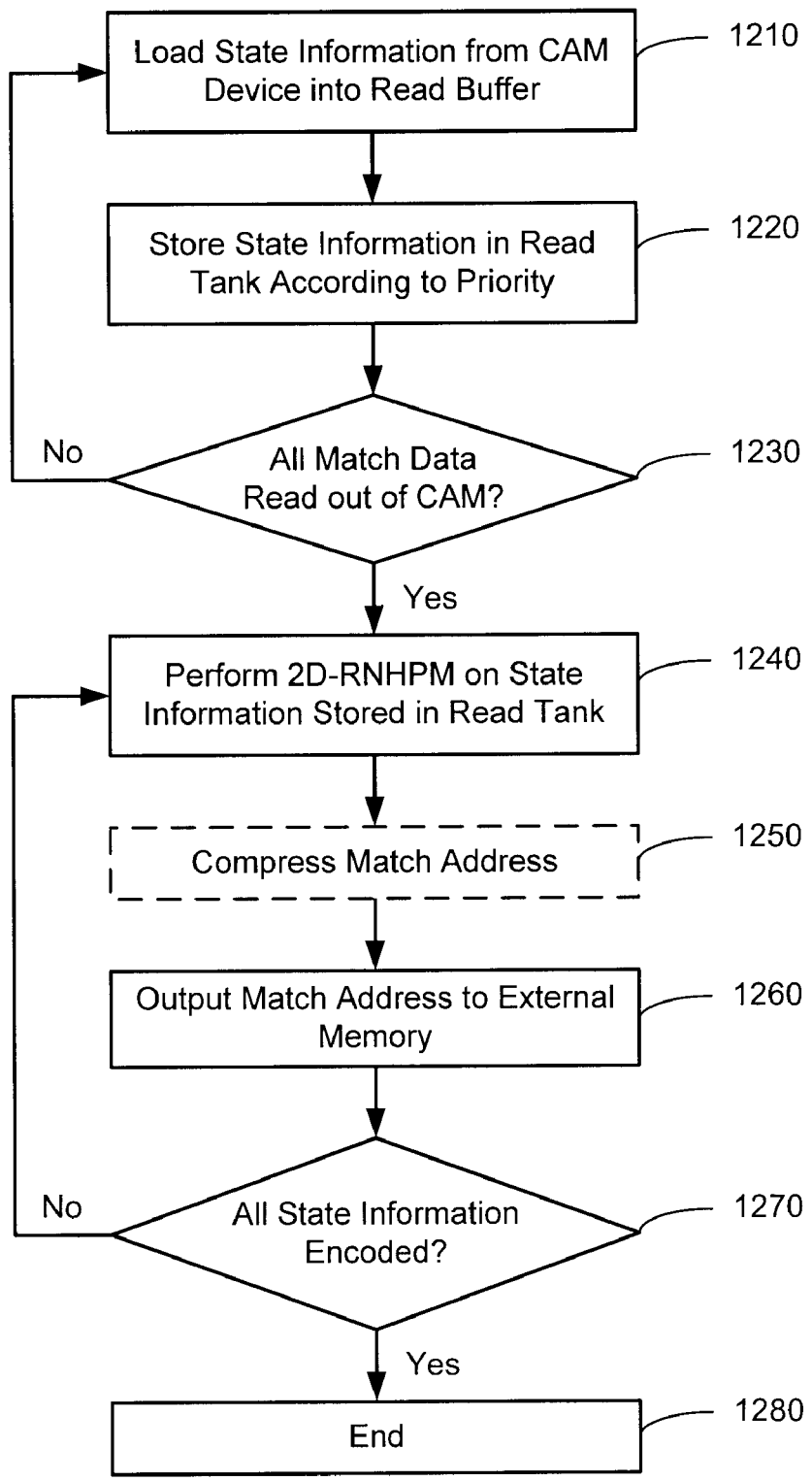
FIG. 12 is an illustrative flow chart depicting an exemplary save state phase of an SSR operation in accordance with some embodiments.

An exemplary operation of the save state circuitry 1100 depicted in FIG. 11 is described below with respect to the illustrative flow chart of FIG. 12. First, state information output from the CAM device during a flow switch operation is loaded into the read buffer 1112 (1210). Referring also to FIGS. 3 and 9, the read buffer 1112 can receive state information in parallel from the read/write circuit 240 of the CAM device via the state data lines SDL. As described above, for some embodiments, each of the state data lines SDL is associated with a corresponding bit line pair in the CAM array, and the bit line pairs are selectively associated with rows of the CAM array via the state information gating circuits 330. Thus, for some embodiments, the state information loaded into the read buffer 1112 corresponds with a selected group of match latches 320 in the CAM array.

The read buffer 1112 then forwards the state information for storage in a corresponding row of the read tank 1114 (1220). For some embodiments, the state information can be stored in read tank 1114 according to priority. For example, referring also to FIG. 9, the CAM rows in row group 910(0) have a higher priority than any of the CAM rows in row groups 910(1) and 910(2), and the CAM rows in row group 910(1) have a higher priority than any of the CAM rows in row group 910(2). Thus, CAM row group 910(0) may have an overall higher priority than CAM row groups 910(1) and 910(2), and CAM row group 910(1) may have an overall higher priority than CAM row group 910(2). Thus, for some embodiments, when state information is read from the match latches 320 in a particular row group 910 of the CAM device and transferred into the read buffer 1112, the state information can be written (e.g., under the control of control circuit 1103) to a corresponding row 1115 of the read tank 1114 based on the CAM row group's priority. For example, state information received from row group 910(0) may be stored in row 1115(0) of read tank 1114 as MLG$_o$, state information received from row group 910(1) may be stored in row 1115(1) of read tank 1114 as MLG$_1$, and so on. In this manner, each row 1115 of the read tank 1114 can store state information for a corresponding row group of the CAM device and maintain the relative priorities between the sets of state information.

Next, a determination is made as to whether all of the state information (e.g., match data) stored in the CAM array's match latches 320 has been read from the CAM device (1230). If not, then state information from the match latches in a subsequent CAM row group are retrieved from the CAM device (1210) and saved in a corresponding (e.g., the next available) row 1115 of the read tank 1114 (1220). This process is repeated until all of the state information is read from the CAM device and saved in the read tank 1114.

When all the state information has been read from the CAM device and saved in the read tank 1114, as tested at 1230, a series of RNHPM operations are performed on the state information stored in the read tank 1114 (1240). As described in more detail below, the VPE 1101 and the HPE 1102 perform priority encoding operations on the rows and columns, respectively, of the read tank 1114. This "two-dimensional" (or 2D) RNHPM operation generates a corresponding match address for each active state bit stored in the read tank 1114. More specifically, for some embodiments, the VPE 1101 identifies which rows 1115 of the read tank 1114 contain active state bits, and generates the row match address RMA for the highest-priority active row in the read tank 1114. Then, for the active row identified by the VPE 1101, the HPE 1102 performs column priority encoding operations to generate a column match address CMA for the highest-priority column (e.g., bit) within the active row 1115.

Referring again to FIG. 12, the match address of the highest-priority state bit is then output for storage in the external memory 1030 (1260). For example, the column match address CMA and the row match address RMA can be concatenated to form the address of the HPM state bit. In an optional and/or alternative embodiment, the match address may be compressed using any suitable compression algorithm prior to storage in external memory 1030 to minimize storage area (1260).

Then, a determination is made as to whether all of the active state bits stored in the read tank 1114 has encoded and stored in the external memory 1030 (1270). If there are any active state bits in the read tank 1114 that have not yet been encoded (or written to external memory), processing continues at 1240 to perform a subsequent 2D-RNHPM operation that generates and stores the match address of the next-highest priority active state bit. This process is repeated until a match address is generated and stored in external memory 1030 for each active state bit contained in the read tank 1114. When match addresses for all active state bits have been generated and stored in the external memory 1030, at tested at 1270, the save state operation terminates (1280). Thereafter, the state save circuitry 1100 is ready to receive and processes state information from another flow (e.g., in response to another SSR operation). This pipelined process allows the CAM device to quickly switch between multiple flows with limited down time.

As described above, the VPE 1101 first identifies which rows 1115 of the read tank 1114 contain active state bits, and then for each identified active row 1115, the HPE 1102 generates the match address for each active state bit therein. The resulting RMA and CMA for each active state bit in the read tank 1114 are then concatenated to form a match address that is stored in the external memory 1030. In this manner, a match address for each active state bit is stored in the external memory 1030. Note that if a particular row 1115 in the read tank 1114 does not include an active state bit, then the VPE 1101 does not select that row for processing by the HPE 1102, and no corresponding address is generated or stored in the external memory 1030. In this manner, match addresses are generated only for the active state bits stored in the read tank 1114, thereby advantageously reducing the 2D-RNHPM processing time and minimizing the storage area consumed by the match addresses.

Figure 13:
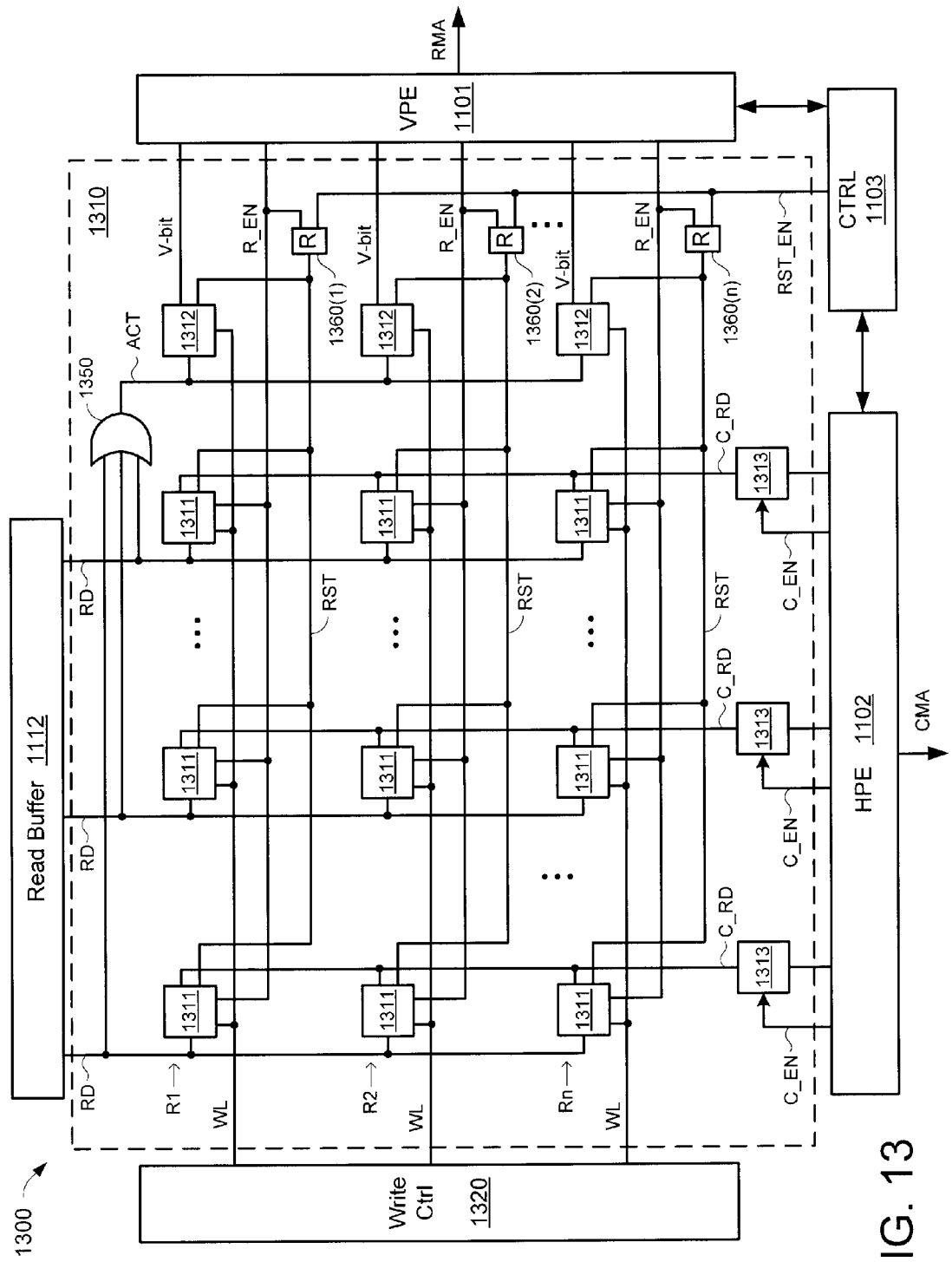
FIG. 13 shows a more detailed block diagram of one embodiment of the save state circuitry of FIG. 11.

FIG. 13 shows a more detailed block diagram of one embodiment of the save state circuitry of FIG. 11. The save state circuitry 1300 includes read buffer 1112, vertical priority encoder 1101, horizontal priority encoder 1102, control circuit 1103, a read tank 1310, and a write controller 1320. Read tank 1310, which is one embodiment of read tank 1114 of FIG. 11, includes an array of memory cells 1311, a column of activity cells 1312, a row of priority buffer cells 1313, and a column of reset circuits 1360. Each row (R1-Rn) of the read tank 1310 includes a number of memory cells 1311 and an activity cell 1312 coupled to the write control circuit 1320 via a corresponding word line WL. Further, the memory cells 1311 in each row are coupled to the VPE 1101 and to a corresponding reset circuit 1360 via an associated read enable line (R_EN), and the activity cell 1312 in each row provides a valid bit (V-bit) to the VPE 1101. Each column of memory cells 1311 is coupled to read buffer 1112 via a corresponding read line RD.

The memory cells 1311 store bits of state information provided to the read tank 1310 via the read buffer. Each of the activity cells 1312 stores a valid bit indicating whether the corresponding row of read cells 1311 contains at least one active state bit. As shown in FIG. 13, the activity cells 1312 receive an activity signal (ACT) generated by an OR gate 1350 having inputs coupled to the read lines RD. The OR gate 1350 generates the activity signal ACT signal as a logic-OR combination of the state bits provided on the read lines RD, and the ACT signal is provided as a set signal to the activity cells 1312.

More specifically, when state information is received by the read buffer 1112 from the CAM device, the write controller 1320 selectively activates one of the word lines WL to enable the read buffer 1112 to write the state information into a corresponding row of memory cells 1311. The state information is then written into the memory cells 1311 of the selected row, and the OR gate 1350 generates the ACT signal to selectively set the activity cell 1312 for the selected row. In this manner, if an active state bit is stored in any of the memory cells 1311 of the selected row, the ACT signal is asserted and sets the activity cell 1312 of the selected row to an asserted (e.g., logic high) state. Thus, the valid bits stored in the activity cells 1312 can be easily used by the VPE 1101 to determine which rows in the read tank 1310 contain active state bits. Once all of the state information from the CAM device is stored in the read tank 1310, the VPE 1101 and the HPE 1102 generate match addresses for each active state bit stored in the array of read cells 1311 by performing one or more 2D-RNHPM operations.

Figure 14:
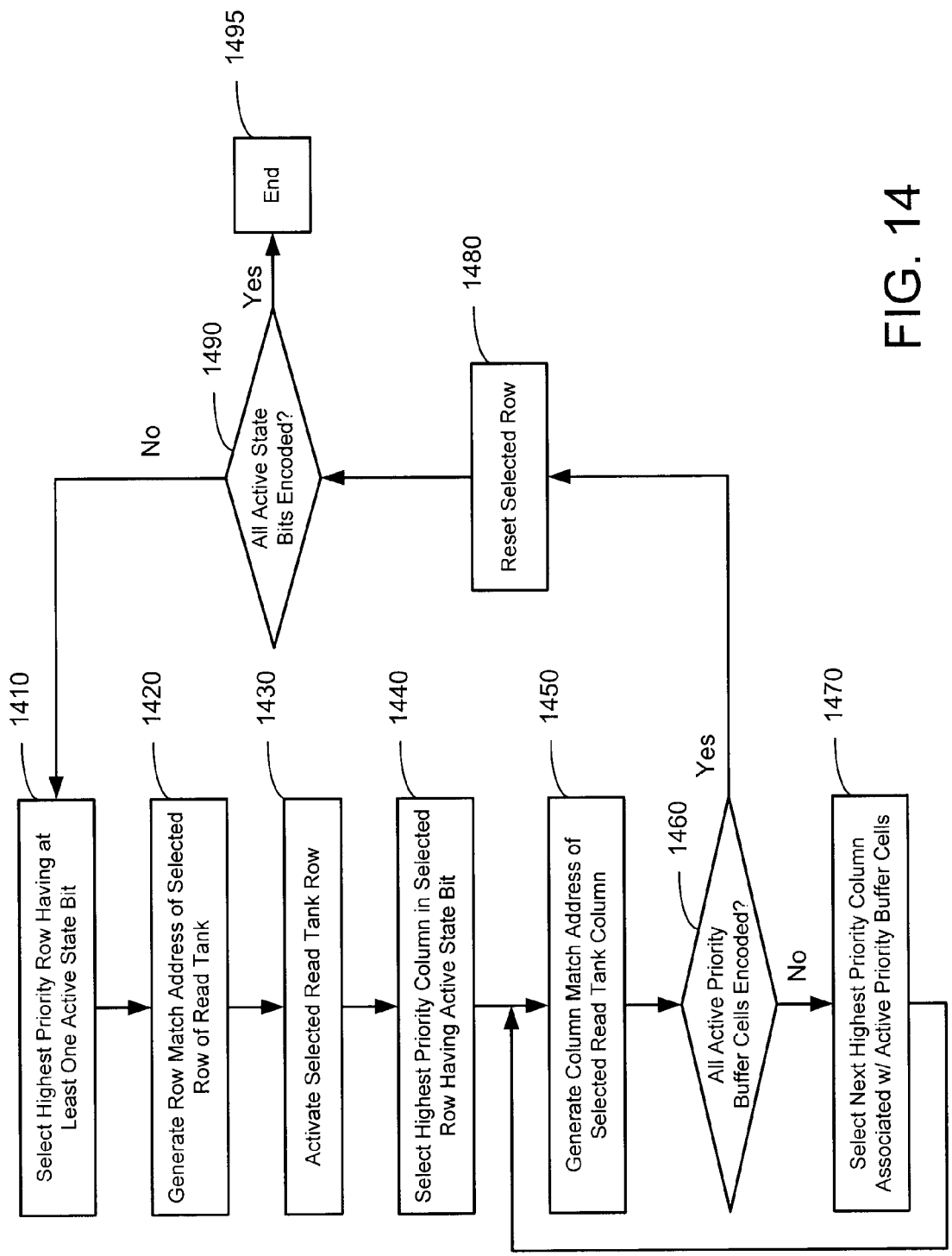
FIG. 14 is an illustrative flow chart depicting an exemplary two-dimensional read-next-highest-priority-match operation according to some embodiments.

An exemplary 2D-RNHPM operation performed by the save state circuitry of FIG. 13 is described below with respect to the illustrative flow chart of FIG. 14. First, the VPE 1101 selects the highest priority row R1-Rn in the read tank 1310 that has at least one active state bit (1410). For some embodiments, the VPE 1101 combines the valid bits provided by all the activity cells 1312 and determines which one is associated with a highest priority row address (e.g., the lowest row address value). For some embodiments, the 2D-RNHPM operation terminates if none of the activity cells 1312 contain asserted valid bits.

Next, the VPE 1101 generates a row match address RMA associated with the highest-priority row that contains an active state bit (1420). For some embodiments, the VPE 1101 provides the row match address RMA to a row address buffer (not shown for simplicity), where it is stored until a subsequent row match address RMA is generated by the VPE 1101. Alternatively, the VPE 1101 may provide the row match address RMA directly to the external memory 1030.

Then, the VPE 1101 activates the selected HPM row by asserting its corresponding read enable line R_EN (1430). Assertion of the R_EN line causes each memory cell 1311 in the selected row to output its stored state bit onto a respective column read line C_RD. The state bits on the C_RD lines are then latched into priority buffer cells 1313 in response to assertion of column enable signals on lines C_EN, and provided to the HPE 1102.

In response thereto, the HPE 1102 selects the highest priority column associated with the active priority buffer cell(s) 1313 (1430). More specifically, the HPE 1102 selects the asserted priority buffer cell 1313 associated with a highest priority column address, and then generates a column match address CMA associated with the selected column (1450). For some embodiments, each column match address CMA generated by the HPE 1102 is concatenated with the row match address RMA stored in the row address buffer to form a match address for the corresponding highest-priority active state bit, and the match address is then stored in external memory 1030. Alternatively, the VPE 1101 can generate the current row match address RMA each time the HPE 1102 generates an associated column match address CMA.

Then, a determination is made as to whether all the active state bits stored in active priority buffer cells 1313 has been encoded into corresponding column match addresses (1460). If not, the HPE 1102 selects the next highest priority column associated with the active priority buffer cells (1470), and generates a corresponding column match address CMA for the selected column (1450). This process is repeated until data from all of the active priority buffer cells 1313 has been encoded into column match addresses.

When all the active state bits stored in active priority buffer cells 1313 have been encoded by the HPE 1102, as tested at 1460, the control circuit 1103 resets (e.g., to logic low states) all the memory cells 1311 and the activity cell 1312 in the selected row of read tank 1310 (1480). More specifically, the control circuit 1103 initiates a reset operation by activating the reset-enable signal line RST_EN coupled to reset circuits 1360(1)-1360(n). The reset circuits 1360(1)-1360(n) perform a gating function by activating a corresponding reset signal line RST in response to the asserted RST_EN signal line only if the R_EN line is also asserted for the selected row by the VPE 1101. In this manner, a row of memory cells 1311 is reset only if all of the active state bits stored in the row have been processed by the priority encoders 1101 and 1102.

Then, a determination is made as to whether the data stored in all of the active activity cells has been encoded into corresponding row match addresses (1490). If not, the 2D-RN-HPM operation returns to 1410, and the VPE 1101 selects the next highest priority row associated with the active activity cells 1312. Because the activity cell 1312 associated with the previous highest priority row was reset in 1480, the VPE 1101 uses the valid bits provided by the activity cells 1312 to select the next highest priority row that contains one or more active state bits. The process depicted in steps 1410-1480 is repeated until all rows containing active state bits are reset, after which the 2D-RNHPM operation terminates (1495).

The 2D-RNHPM operation described above allows for streamlined processing of state information received from the associated CAM device. More specifically, the 2D-RNHPM operation can be performed by the save state circuitry 1300 while the CAM device is performing search operations for another flow, thereby allowing the state information for a first flow to be processed and saved as HPM addresses in external memory 1030 while a second flow is processed by the CAM device. In this manner, processing and saving the state information for the first flow does not result in any down-time for the CAM device, thereby maximizing search engine throughput.

Figure 15:
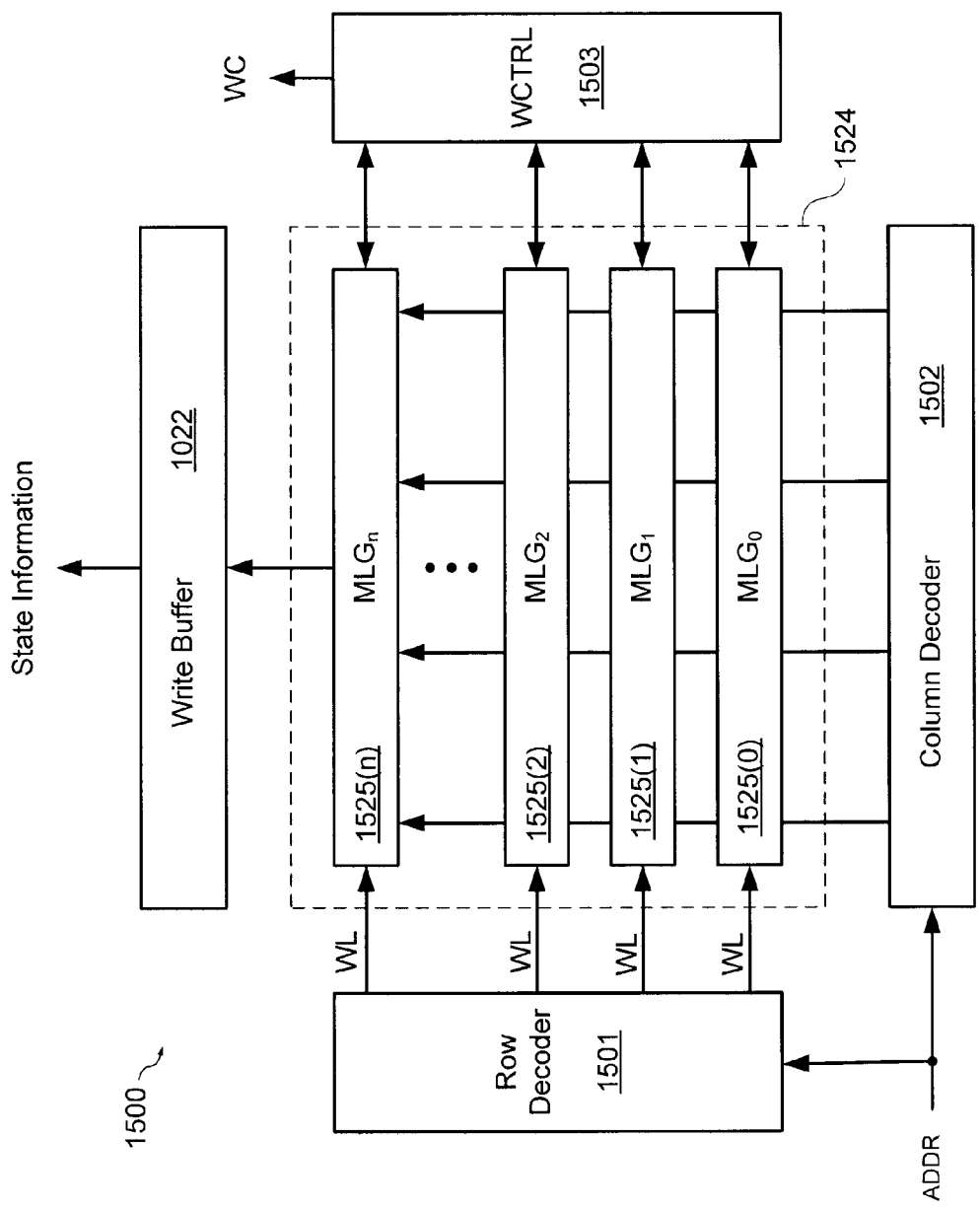
FIG. 15 shows a simplified block diagram of one embodiment of the restore state circuitry of FIG. 10.

FIG. 15 shows a block diagram of restore state circuitry 1500 that is one embodiment of the restore state circuitry 1020 of FIG. 10. Restore state circuitry 1500 includes write buffer 1022, a write tank 1524, a row decoder 1501, a column decoder 1502, and a write controller (WRCTRL) 1503 that controls operation of the restore state circuitry 1500. Row decoder 1501 and column decoder 1502, which together form one embodiment of the address decoder 1026 of FIG. 10, are configured to decode match addresses (ADDR) retrieved from external memory 1030 into state information for storage in the write tank 1524. In this manner, the row decoder 1501 and the column decoder 1502 recreate the original state information received from the CAM device during the save state phase of the SSR operation.

For the exemplary embodiment shown in FIG. 15, both the row decoder 1501 and the column decoder 1502 receive the same match address ADDR from the external memory 1030. However, for alternative embodiments, row decoder 1501 may receive only the row address portion of ADDR, and the column decoder 1502 may receive only the column address portion of ADDR.

The write tank 1524 includes an array of memory cells (not shown for simplicity) arranged in a number of rows and columns. Each row 1525 of memory cells, which is configured to store a set of state information decoded by decoders 1501-1502, is coupled via a corresponding word line WL to row decoder 1501 and to the write controller 1503. The columns of write tank 1524 are coupled to the column decoder 1502 and to the write buffer 1022. The write buffer 1022 temporarily stores state information to be restored to the CAM device from a selected row 1525 of the write tank 1524. For some embodiments, the write controller 1503 determines which of the rows 1525 (if any) of the write tank 1524 store active state bits to ensure that write buffer 1022 is loaded only with data from the active rows of write tank 1524. For example, if none of the state bits within the state information for the match latch group $MLG_1$ stored in row 1525(1) are active, then the state information contained in row 1525(1) is not loaded into the write buffer 1022, and is therefore not restored to the match latches in the corresponding row group in the CAM device. Instead, the match latches in the corresponding row group in the CAM device can be reset to logic low states using well-known circuitry in the CAM device. This allows for faster and more efficient writing of state information to the CAM device, as explained in more detail below.

Figure 16:
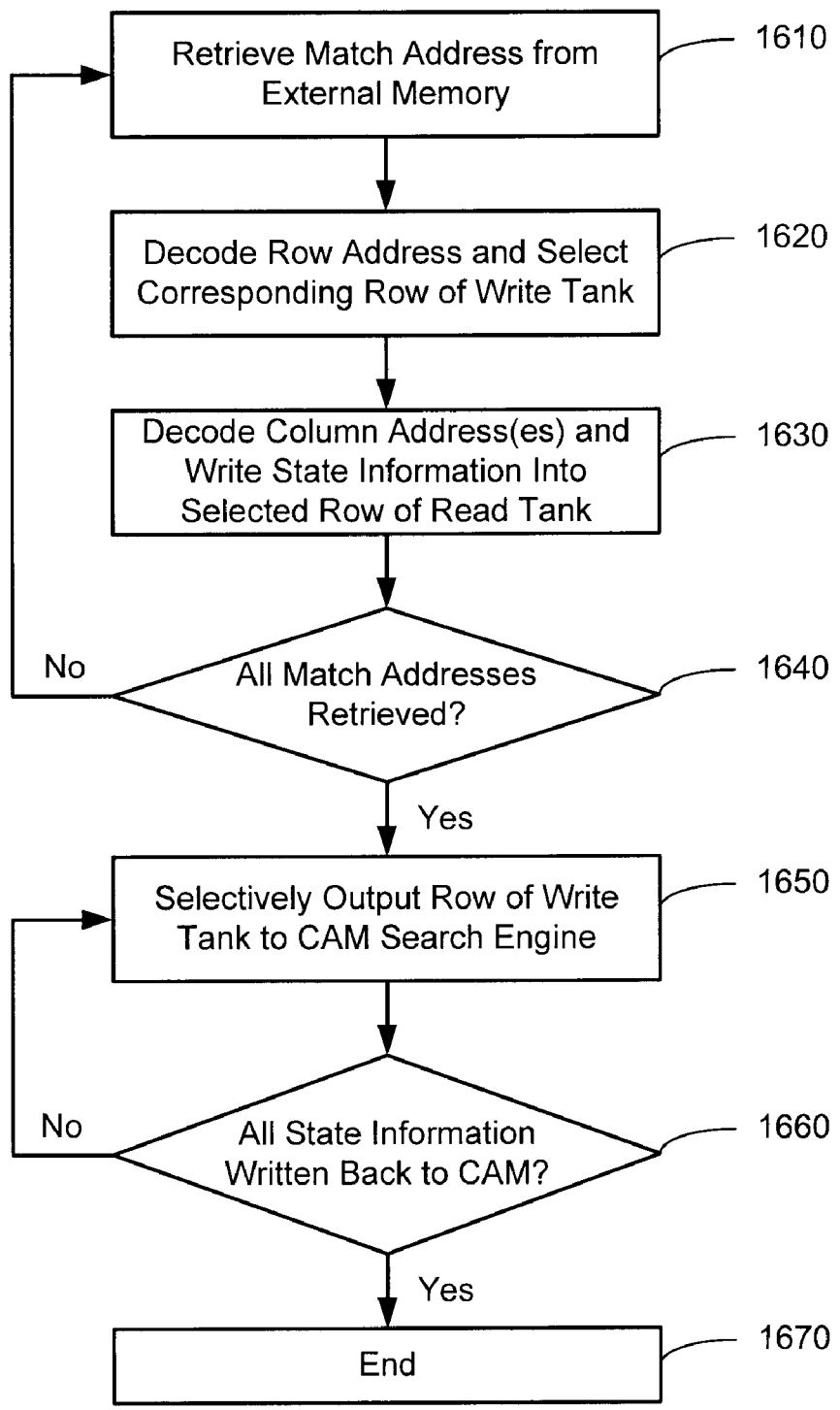
FIG. 16 is an illustrative flow chart depicting an exemplary restore state phase of an SSR operation in accordance with some embodiments.

An exemplary operation of the restore state circuitry 1500 depicted in FIG. 15 is described below with respect to the illustrative flow chart of FIG. 16. First, a match address is retrieved from external memory 1030 by row decoder 1501 and column decoder 1502 (1610). For some embodiments, the match addresses are stored in external memory 1030 according to priority (e.g., as described above with respect to FIGS. 11-14), and therefore row decoder 1501 and column decoder 1502 may retrieve the match address from the external memory in order of priority.

Then, the row decoder 1501 decodes the row address portion of ADDR and activates the WL of a corresponding row 1525 of the write tank 1524. In one embodiment, row decoder 1501 may receive only the row address portion of ADDR. Alternatively, row decoder 1501 may receive the entire match address (including both the row and column address portions), and simply parse out and/or decode only the row address portion.

Then, the column decoder 1502 decodes one or more column addresses and writes corresponding state information into the activated row of the write tank 1524 (1630). In one embodiment, column decoder 1502 may receive only the column address portion of a received match address. Alternatively, column decoder 1502 may receive the entire match address and parse out and/or decode only the column address portion. In another embodiment, column decoder 1502 may retrieve multiple column addresses associated with a particular row address. The column decoder 1502 then writes the decoded column address as state information into one or more columns of memory cells in the row 1525.

Thus, in steps 1610-1630, row decoder 1501 and column decoder 1502 recreate a set of state information (i.e., in the form in which it was originally received from the CAM device during a save state phase of the SSR operation) from the match addresses stored in external memory 1030. This allows the state information to be written back to the match latches of the CAM device in a quick and efficient manner during a restore state phase of the SSR operation.

Then, a determination is made as to whether all of the match addresses have been retrieved from external memory 1030 (1640). If not, row decoder 1501 and column decoder 1502 retrieve the next match address from external memory (1610), and in response thereto recreate the state information and write it into the write tank 1524 at (1620-1630). This process is repeated until all the match addresses are retrieved from the external memory and stored as state information in the write tank 1524.

When all of the match addresses have been retrieved from external memory 1030, as tested at 1640, the write buffer 1022 outputs state information from a selected row 1525 of the write tank 1524 to the CAM device (1650). For some embodiments, the write controller 1503 selects the highest priority row 1525 of the write tank 1524 that contains an active state bit. As described in more detail below, the write controller 1503 selects only the rows (if any) that contain at least one active state bit for loading into the CAM device via the write buffer 1022. For one embodiment, write controller 1503 outputs a write control signal WC to the CAM device that activates a corresponding group of state information gating circuits 330 in the CAM device to route the state information output from write buffer 1022 to the match latches 320 in a corresponding CAM row group.

For example, referring also to FIG. 9, when write buffer 1022 outputs state information labeled "$MLG_0$" from row 1525(0) of write tank 1524, the write controller 1504 can generate an WC signal that turns on gating circuits 330 associated with row group 910(0) of the CAM device, thereby allowing the state information to be restored to the match latches 320 within the row group 910(0).

Next, a determination is made as to whether all of the state information in the write tank 1524 has been restored to the CAM device (1660). If not, the write buffer 1022 is loaded with state information from another row 1525 of write tank 1524 (e.g., the row having the next highest priority), and writes the state information to the match latches 320 in a corresponding CAM row group of the CAM device (1650). This process is repeated until the state information from all rows 1525 of the write tank 1524 containing at least one active state bit has been restored to the CAM device.

When all of the state information has been restored from the write tank 1024 to the CAM device, the process of restoring state information terminates (1670). Because only selected rows 1525 of the write tank 1524 having at least one active state bit are written back to the CAM device, the restore state phase of the SSR operation may be much shorter than the save state phase of the SSR operation. Moreover, this pipelined process further allows the CAM device to quickly switch between multiple flows.

In some alternative embodiments, the write buffer 1022 does not wait until all the match addresses are retrieved from external memory 1030 before restoring state information back to the CAM device. For example, the write buffer 1022 may output state information to the CAM device as soon corresponding data is written to a row 1525 of the write tank 1524. Accordingly, the write buffer 1022 may write state information to the CAM device at the same time that row decoder 1501 and column decoder 1502 process match addresses retrieved from external memory 1030.

Figure 17:
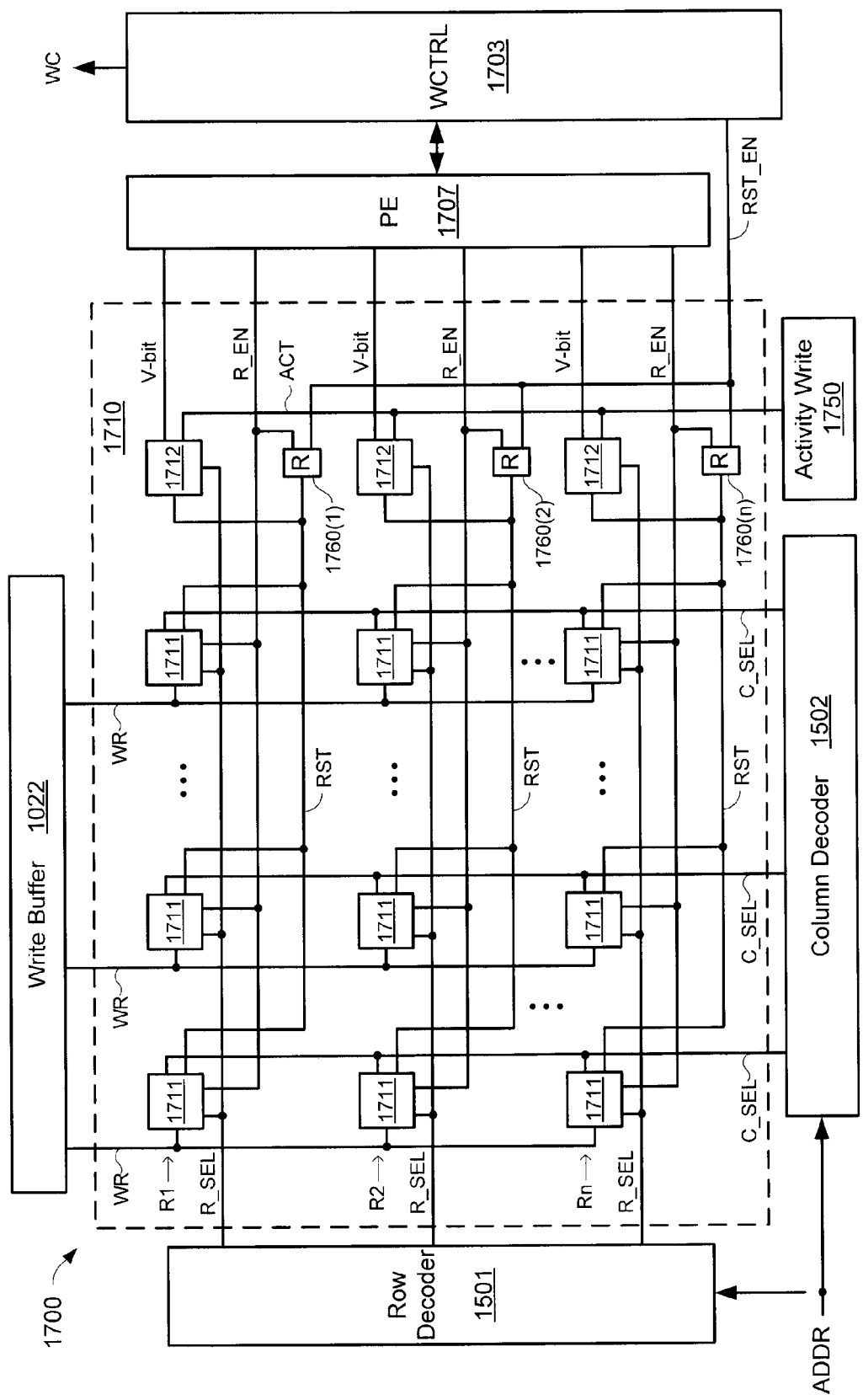
FIG. 17 shows a more detailed block diagram of one embodiment of the restore state circuitry of FIG. 15.

FIG. 17 shows a more detailed block diagram of an embodiment of the restore state circuitry shown in FIGS. 10 and 15. The restore state circuitry 1700 includes write buffer 1022, row decoder 1501, column decoder 1502, a write controller 1703, a write tank 1710, a priority encoder 1707, and an activity write circuit 1750. The write tank 1710, which is one embodiment of the write tank 1524 of FIG. 15, includes an array of memory cells 1711, a column of activity cells 1712, and a column of reset circuits 1760(1)-1760(n). The write cells 1711 are arranged in a number of rows R1-Rn and columns. The memory cells 1711 in each row are coupled to row decoder 1501 and an associated activity cell 1712 via a corresponding row select line R_SEL, and are configured to store a set of state information output in parallel from column decoder 1502 via column select lines C_SEL.

Each activity cell 1712 stores a valid bit indicating whether the corresponding row of memory cells 1711 contains at least one active state bit. For some embodiments, the activity cells 1712 are coupled to the activity write circuit 1750 via an activity line ACT. For example, when row decoder 1501 selects a row of the write tank 1710 (e.g., by asserting the associated R_SEL line), the activity write circuit 1750 drives an active valid bit into the corresponding activity cell 1712 coupled to the asserted R_SEL line by asserting the activity line ACT. Thus, if a memory cell 1711 in a selected row stores an active state bit, the activity cell 1712 coupled associated with the selected row stores an asserted valid bit indicating that the row contains active state bits. Conversely, if none of the memory cells 1711 in the selected row stores an active state bit, the activity cell 1712 coupled associated with the selected row stores a de-asserted valid bit indicating that the row does not contain active state bits. The outputs of the activity cells 1712 are coupled to priority encoder 1704, which in response to the V-bits quickly determines which (if any) of the rows R1-Rn contain one or more active state bits.

More specifically, for some embodiments, when row decoder 1501 and column decoder 1502 retrieve a match address ADDR from the external memory 1030, the row decoder 1501 selectively asserts one of the R_SEL lines to enable the column decoder 1502 to write decoded state information into the selected row of memory cells 1711. At the same time, the activity write circuit 1750 writes a valid bit into activity cell 1712 for the selected row indicating whether the selected row contains at least one active state bit. Once all of the match addresses have been retrieved from external memory 1030, the write buffer 1022 and the write controller 1703 selectively write the decoded state information back into the CAM device.

Figure 18:
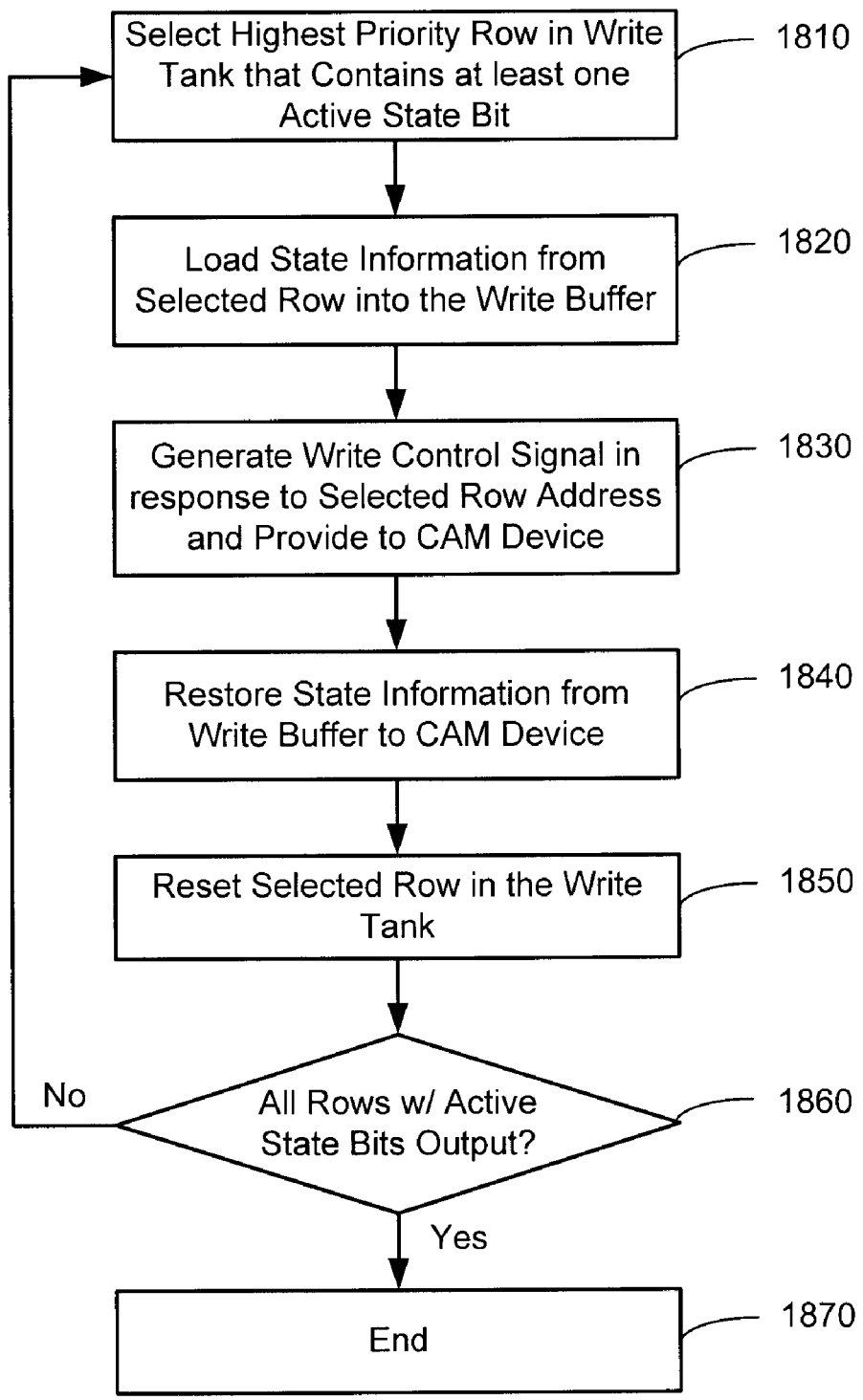
FIG. 18 is an illustrative flow chart depicting an exemplary state restore operation according to some embodiments.

An exemplary restore state operation performed by the restore state circuitry depicted in FIG. 17 is described below with respect to the illustrative flow chart of FIG. 18. First, the priority encoder 1704 selects the highest priority row R1-Rn in the write tank 1710 that contains at least one active state bit (1810). For some embodiments, the priority encoder 1704 selects the highest priority row using the valid bits provided thereto by the activity cells 1712. For one embodiments, the state restore operation terminates if none of the activity cells 1712 store asserted valid bits.

Then, the priority encoder 1704 enables the data stored in the selected row of memory cells 1711 to be loaded into the write buffer 1022 (1820). For example, after determining the highest priority row address, the priority encoder 1704 asserts the R_EN line for the selected row. Assertion of the R_EN line causes each memory cell 1711 in the selected row to output its state bit onto a respective write line WR, which in turn provides the state bits to the write buffer 1022. For one embodiment, the priority encoder 1704 also generates a highest priority match address (HPM) corresponding to the selected row to the write controller 1703.

Then, the write controller 1703 generates a write control signal (WC) in response to the selected row and outputs the WC signal to the CAM device (1830), and the write buffer 1022 outputs the state information to the CAM device (1840). The WC signal selects one of the groups of match latches 320 in the CAM device to receive the state information from the write buffer 1022. More specifically, the WC signal can be decoded by circuitry in the CAM device to turn on the gating circuits 330 associated with the selected CAM row group in the CAM device. For example, referring also to FIG. 9, the memory cells 1711 in row R1 may correspond with match latches 320 of row group 910(0) in the CAM device. Thus, if the R_EN line associated with row R1 is asserted, the write controller 1703 may generate a WC signal that turns on gating circuits 330 of row group 910(0) so that state information provided to the CAM device by the write buffer 1022 is routed from the CAM array's bit lines into the match latches 320 of row group 910(0). For some embodiments, the write controller 1703 generates the WC signal in response to the HPM data generated by the priority encoder 1707.

Then, the selected row in the write tank 1710 is reset (1850). For example, the write controller 1703 initiates a reset operation by asserting the reset-enable signal line RST_EN coupled to reset circuits 1760(1)-1760(n). The reset circuits 1760(1)-1760(n) perform a gating function by asserting a corresponding reset signal line RST in response to the asserted RST_EN signal line only if the R_EN line is also asserted for a given row. This ensures that a row in the write tank 1710 is reset only if all of the data stored in that row has been written back to the CAM device, or at least loaded into the write buffer 1022. Upon detecting an active RST signal line, each of the memory cells 1711 and the activity cell 1712 coupled to that RST signal line are reset (i.e., deactivated or de-asserted).

Then, a determination is made as to whether all of the rows R1-Rn associated with active activity cells 1712 have been output to the CAM device (1860). If not, the priority encoder 1707 proceeds to select the next highest priority row having at least one active state bit (1810). Because the activity cell previously associated with the highest priority row address was rest in step 1850, PE 1704 can simply select the highest priority row associated with the activity cells 1712 that are still active. The entire cycle (i.e., steps 1810-1860) is repeated until all active rows are reset, wherein the state restore operation terminates at 1870.

The state restore operation described above allows state information to be quickly and efficiently written back to a CAM device during a restore phase of an SSR operation. This, in turn, allows the CAM device to transition between multiple flows with little down time in between.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A search system comprising:
    a content addressable memory (CAM) device configured to perform save state and restore (SSR) operations in which match information associated with a first flow is read from the CAM device during a flow switch operation;
    SSR processing circuitry coupled to the CAM device and configured to encode the match information into a plurality of match addresses while the CAM device is generating match information associated with a second flow; and
    a memory device coupled to the SSR processing circuitry and configured to store the plurality of match addresses, wherein each match address identifies a corresponding active match bit within the match information, and wherein only the match addresses corresponding to active match bits are stored in the external memory according to priority.

2. The search system of claim 1, wherein each active match bit indicates a match condition during a compare operation between a search key and data stored in an array of CAM cells in the CAM device.

3. The search system of claim 1, wherein the match addresses are stored in the external memory according to priority.

4. The search system of claim 1, wherein the CAM device comprises:
    an array of CAM cells arranged in a plurality of rows and columns of CAM cells, wherein each row of CAM cells is coupled to a match latch by a corresponding match line; and
    gating circuitry configured to read a plurality of match bits stored in the match latches of a selected group of CAM rows from the CAM array in parallel using a plurality of bit lines associated with columns of the CAM array.

5. The search system of claim 1, wherein the SSR processing circuitry includes save state circuitry comprising:
    a read tank having a plurality of rows and a number of columns of memory cells, each row for storing the match information from a corresponding one of a plurality of groups of rows of CAM cells in the CAM device; and
    priority encoding circuitry configured to generate the match addresses of all active match bits within the match information according to priority.

6. The search system of claim 5, wherein the priority encoding circuitry further comprises:
    a vertical priority encoder having a plurality of inputs each coupled to a corresponding row of the read tank and configured to select a highest priority row that has an active match bit; and
    a horizontal priority encoder having a plurality of inputs each coupled to a corresponding column of the read tank and configured to generate a column address of a highest priority memory cell in the selected row that has an active match bit.

7. The search system of claim 6, wherein:
the read tank further comprises a plurality of validity bits each indicating whether one or more of the match bits in a corresponding row of the read tank is active; and
the vertical priority encoder uses the valid bits to identify which rows of the read tank store at least one active match bit.

8. The search system of claim 7, wherein the horizontal priority encoder generates column addresses only for the rows identified by the vertical priority encoder as having active match bits.

9. The search system of claim 8, further comprising:
a write tank for writing the first set of state information back to the CAM device during a restore phase of the SSR operation; and
decoding circuitry coupled to receive the match addresses from the external memory, the decoding circuitry being configured to recreate the first set of state information to be stored in the write tank based on the received match addresses.

10. The search system of claim 9, wherein the write tank comprises a plurality of write cells to store the first set of state information, and wherein the plurality of write cells are configured in rows and columns to form an array of write cells.

11. The search system of claim 10, wherein each row of write cells corresponds with a group of match latches in the CAM device.

12. The search system of claim 10, further comprising a write controller coupled to the write tank and the CAM device to selectively enable only rows containing at least one active write cell to be written to the CAM device.

13. The search system of claim 12, wherein the write tank is configured to iteratively output each row containing at least one active write cell to the CAM device in order based, at least in part, on a priority associated with each row.

14. The search system of claim 1, wherein the memory device is external to the CAM device.

15. A memory device coupled to a content addressable memory (CAM) device and configured to perform save state and restore (SSR) operations, the memory device comprising:
a read tank to store a first set of state information received from the CAM device during a save phase of an SSR operation, wherein the first set of state information comprises match results for a first flow processed in the CAM device;
priority encoding circuitry configured to generate match addresses for the first set of state information based on a prioritization scheme while the CAM device generates a second set of state information comprising match results for a second flow processed in the CAM device; and
a memory for storing the match addresses, wherein each match address identifies a corresponding active match bit within the match information, and wherein only the match addresses corresponding to active match bits are stored in the external memory according to priority.

16. The memory device of claim 15, further comprising:
an address decoder coupled to the memory and configured to recreate the first set of state information from the match addresses stored in the memory; and
a write tank for writing the first set of state information back to the CAM device during a restore phase of the SSR operation.

17. The memory device of claim 15, wherein the CAM device comprises:
an array of CAM cells arranged in a plurality of rows and columns of CAM cells, wherein each row of CAM cells is coupled to a match latch by a corresponding match line; and
gating circuitry configured to read a plurality of match bits stored in the match latches of a selected group of CAM rows from the CAM array in parallel using a plurality of bit lines associated with columns of the CAM array.

18. The memory device of claim 17, wherein the read tank comprises:
a plurality of rows and a number of columns of memory cells, each row for storing the match information from a corresponding one of a plurality of groups of rows of CAM cells in the CAM device.

19. The memory device of claim 18, wherein the priority encoding circuitry further comprises:
a vertical priority encoder having a plurality of inputs each coupled to a corresponding row of the read tank and configured to select a highest priority row that has an active match bit; and
a horizontal priority encoder having a plurality of inputs each coupled to a corresponding column of the read tank and configured to generate a column address of a highest priority memory cell in the selected row that has an active match bit.

20. The memory device of claim 19, wherein:
the read tank further comprises a plurality of validity bits each indicating whether one or more of the match bits in a corresponding row of the read tank is active; and
the vertical priority encoder uses the valid bits to identify which rows of the read tank store at least one active match bit.

21. The memory device of claim 20, wherein the horizontal priority encoder generates column addresses only for the rows identified by the vertical priority encoder as having active match bits.

22. The memory device of claim 16, wherein the write tank comprises a plurality of write cells to store the first set of state information, and wherein the plurality of write cells are configured in rows and columns to form an array of write cells.

23. The memory device of claim 22, wherein each row of write cells corresponds with a group of match latches in the CAM device.

24. The memory device of claim 22, wherein the write tank is configured to iteratively output each row containing at least one active write cell to the CAM device in order based, at least in part, on a priority associated with each row.

* * * * *